United States Patent
Kaizu et al.

(10) Patent No.: US 10,559,412 B2
(45) Date of Patent: Feb. 11, 2020

(54) MAGNETORESISTANCE EFFECT DEVICE

(71) Applicant: TDK CORPORATION, Tokyo (JP)

(72) Inventors: Akimasa Kaizu, Tokyo (JP); Naomichi Degawa, Tokyo (JP); Tetsuya Roppongi, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 16/204,502

(22) Filed: Nov. 29, 2018

(65) Prior Publication Data
US 2019/0180901 A1    Jun. 13, 2019

(30) Foreign Application Priority Data

Dec. 7, 2017   (JP) .................................. 2017-235229
Aug. 9, 2018   (JP) .................................. 2018-150429

(51) Int. Cl.
*H01F 10/32*  (2006.01)
*H01L 43/02*  (2006.01)
(Continued)

(52) U.S. Cl.
CPC ....... *H01F 10/3259* (2013.01); *H01F 10/324* (2013.01); *H01F 10/329* (2013.01); *H01L 27/22* (2013.01); *H01L 43/02* (2013.01); *H03B 15/006* (2013.01); *H03F 15/00* (2013.01); *H03H 2/00* (2013.01); *H03H 11/04* (2013.01);
(Continued)

(58) Field of Classification Search
CPC .. H01F 10/3259; H01F 10/324; H01F 10/329; G01R 33/093; H03H 2/00; H03H 11/16; H03H 11/04; H01L 27/22; H01L 43/02; H01L 43/10; H03F 15/00; H03B 15/006
See application file for complete search history.

(56) References Cited

U.S. PATENT DOCUMENTS

2001/0040777 A1*  11/2001  Watanabe .............. B82Y 10/00
                                              360/321
2002/0030945 A1*   3/2002  Odagawa .............. B82Y 10/00
                                              360/313
(Continued)

FOREIGN PATENT DOCUMENTS

JP    2017-063397 A    3/2017

*Primary Examiner* — Victor A Mandala
(74) *Attorney, Agent, or Firm* — Oliff PLC

(57) ABSTRACT

At least one magnetoresistance effect element and a magnetic field applying unit to apply a magnetic field to the magnetoresistance effect element, the magnetic field applying unit includes a first ferromagnetic material having a portion protruding to the magnetoresistance effect element side in a stacking direction of the magnetoresistance effect element, a second ferromagnetic material sandwiching the magnetoresistance effect element with the first ferromagnetic material, and a coil wound around the first ferromagnetic material, a first magnetization free layer of the magnetoresistance effect element has a portion free of overlapping with at least one of a second surface of the protruding portion on the magnetoresistance effect element side and a third surface of the second ferromagnetic material on the magnetoresistance effect when viewed in the stacking direction, and a center of gravity of the first magnetization free layer, positioned in a region connecting the second surface and the third surface.

13 Claims, 20 Drawing Sheets

(51) Int. Cl.
  *H03H 11/04* (2006.01)
  *H03B 15/00* (2006.01)
  *H03H 11/16* (2006.01)
  *H03F 15/00* (2006.01)
  *H01L 27/22* (2006.01)
  *H03H 2/00* (2006.01)
  *G01R 33/09* (2006.01)
  *H01L 43/10* (2006.01)

(52) U.S. Cl.
  CPC ........... *H03H 11/16* (2013.01); *G01R 33/093* (2013.01); *H01L 43/10* (2013.01)

(56) References Cited

U.S. PATENT DOCUMENTS

| | | | | |
|---|---|---|---|---|
| 2003/0161080 | A1* | 8/2003 | Ishikawa | B82Y 10/00 360/324.12 |
| 2008/0198514 | A1* | 8/2008 | Jogo | B82Y 10/00 360/324.1 |
| 2009/0097170 | A1* | 4/2009 | Sato | B82Y 10/00 360/324.12 |
| 2009/0201612 | A1* | 8/2009 | Shimazawa | B82Y 10/00 360/245 |
| 2009/0290264 | A1* | 11/2009 | Ayukawa | B82Y 25/00 360/313 |
| 2011/0038081 | A1* | 2/2011 | Contreras | B82Y 25/00 360/125.03 |
| 2012/0327537 | A1* | 12/2012 | Singleton | G11B 5/3912 360/244 |
| 2013/0255069 | A1* | 10/2013 | Higashi | G01R 3/00 29/595 |
| 2015/0177285 | A1* | 6/2015 | Higashi | G01R 19/0092 324/144 |
| 2016/0277000 | A1 | 9/2016 | Shibata et al. | |
| 2017/0244377 | A1 | 8/2017 | Yamane et al. | |
| 2017/0328963 | A1* | 11/2017 | Schmitt | G01R 33/0052 |
| 2019/0172513 | A1* | 6/2019 | Kariyada | H01L 21/8239 |

* cited by examiner

MAGNETORESISTANCE EFFECT DEVICE

BACKGROUND

The present disclosure relates to a magnetoresistance effect device.

Priority is claimed on Japanese Patent Application No. 2017-235229, filed on Dec. 7, 2017, and on Japanese Patent Application No. 2018-150429, filed on Aug. 9, 2018, the content of which is incorporated herein by reference.

Elements utilizing spin contained in a magnetic material are used for various applications. For example, magnetoresistance effect devices such as a giant magnetoresistance (GMR) element formed of a multilayer film including a ferromagnetic layer and a nonmagnetic layer, and a tunnel magnetoresistance (TMR) element in which an insulating layer (a tunnel barrier layer, a barrier layer) is used for a nonmagnetic layer are known. Magnetoresistance effect elements are used for magnetic sensors, high-frequency components, magnetic heads, non-volatile random access memories (MRAM), or the like.

For example, Patent Document 1 describes a high-frequency device in which a ferromagnetic resonance phenomenon of a magnetoresistance effect element is utilized. A high frequency signal is applied to a ferromagnetic layer included in a magnetoresistance effect element to cause ferromagnetic resonance in magnetization of the ferromagnetic layer. When the ferromagnetic resonance is generated, a resistance value of the magnetoresistance effect element oscillates periodically at a ferromagnetic resonance frequency. Utilizing this variation in the resistance value, the high-frequency device described in Patent Document 1 functions as a high-frequency filter.

PATENT DOCUMENTS

[Patent Document 1] Japanese Unexamined Patent Application, First Publication No. 2017-063397

SUMMARY

A magnetoresistance effect element can be obtained by stacking extremely thin layers of about several nm. The performance of the magnetoresistance effect element is influenced by a stacking surface on which a magnetoresistance effect element is stacked. Therefore, it is difficult to stack a magnetoresistance effect element on an inclined stacking surface. That is, it is difficult to provide a process in which a stacking direction is oblique in a manufacturing process of a magnetoresistance effect device, and thus it is difficult to simply realize a magnetoresistance effect device capable of applying a magnetic field in an oblique direction to a magnetoresistance effect element.

It is desirable to provide a magnetoresistance effect device capable of applying a magnetic field to a magnetization free layer of a magnetoresistance effect element in an oblique direction.

It has been found that a magnetoresistance effect device capable of applying a magnetic field in an oblique direction to a magnetization free layer of a magnetoresistance effect element can be provided by controlling a positional relationship between two ferromagnetic materials sandwiching the magnetoresistance effect element and the magnetoresistance effect element. It has been also found that a frequency band can be expanded to a higher frequency when a magnetic field is obliquely applied to a magnetization free layer of a magnetoresistance effect element in a high-frequency device utilizing a ferromagnetic resonance phenomenon.

That is, the present disclosure provides the following methods.

A magnetoresistance effect device according to a first aspect includes a magnetoresistance effect element including a first magnetization free layer, a magnetization fixed layer or a second magnetization free layer, and a spacer layer sandwiched between the first magnetization free layer and the magnetization fixed layer or the second magnetization free layer, and a magnetic field applying unit configured to apply a magnetic field at least to the first magnetization free layer of the magnetoresistance effect element, in which the magnetic field applying unit includes a first ferromagnetic material having a protruding portion protruding from a first surface to the magnetoresistance effect element side in a stacking direction of the magnetoresistance effect element, a second ferromagnetic material sandwiching the magnetoresistance effect element together with the first ferromagnetic material, and a coil wound around the first ferromagnetic material, the first magnetization free layer of the magnetoresistance effect element includes a portion free of overlapping with at least one of a second surface of the protruding portion on the magnetoresistance effect element side in the stacking direction and a third surface of the second ferromagnetic material on the magnetoresistance effect element side in the stacking direction in a plan view when viewed in the stacking direction, and a center of gravity of the first magnetization free layer of the magnetoresistance effect element is positioned in a region connecting the second surface and the third surface.

DETAILED DESCRIPTION

Figure 1:
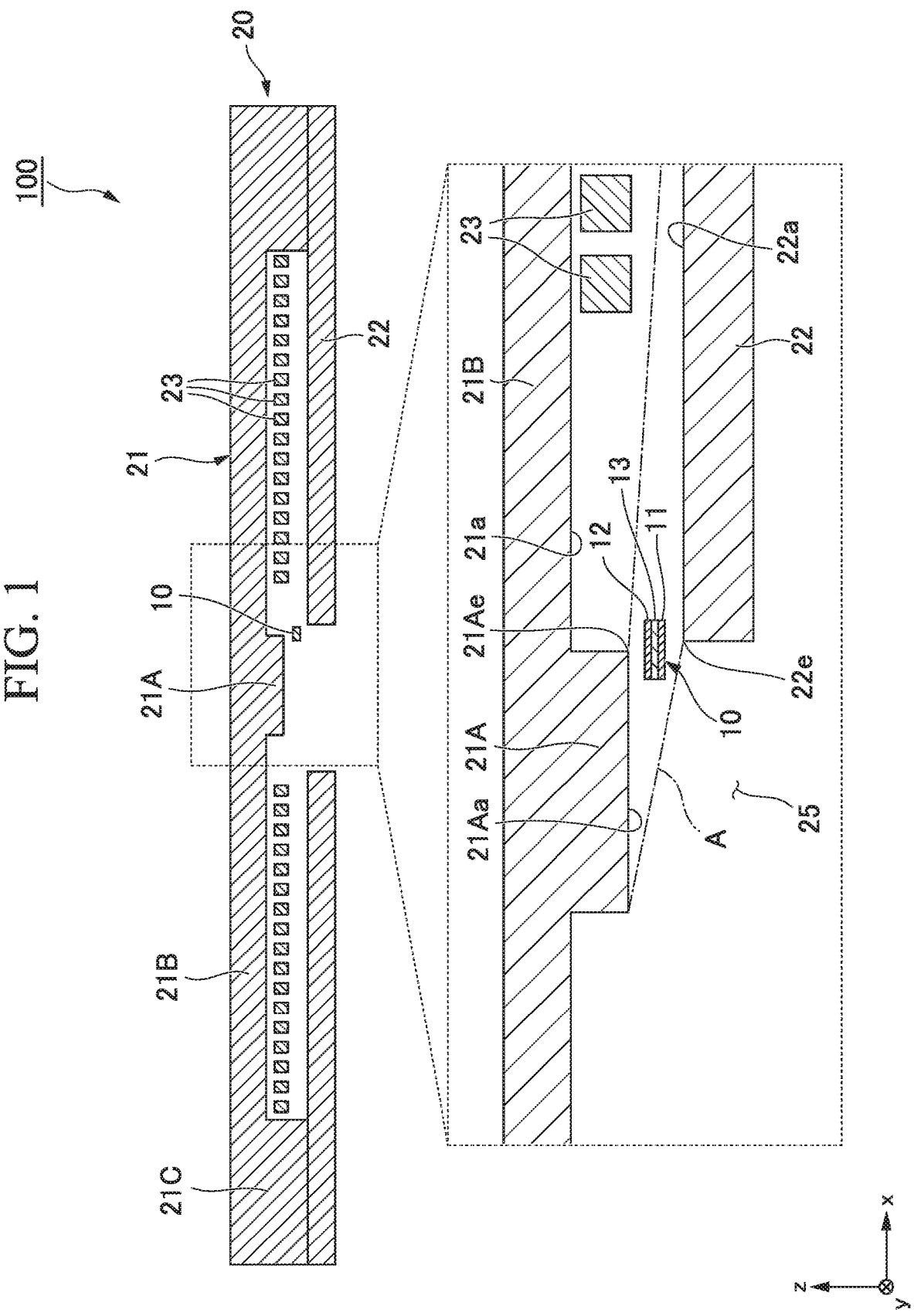
FIG. 1 is a schematic cross-sectional view of a magnetoresistance effect device according to a first embodiment.

Hereinafter, a magnetoresistance effect device will be described in detail with reference to the drawings as appropriate. In the drawings used in the following description, there are cases in which characteristic portions are appropriately enlarged for convenience of illustration so that characteristics of the present disclosure can be easily understood, and dimensional proportions of respective constituent elements may be different from actual ones. Materials, dimensions, and the like illustrated in the following description are merely examples, and the present invention is not limited thereto and can be implemented with appropriate modifications within a range in which the effects of the present disclosure are achieved.

First Embodiment

FIG. 1 is a schematic cross-sectional view of a magnetoresistance effect device according to a first embodiment, and also illustrates an enlarged view of a main portion thereof. A magnetoresistance effect device 100 illustrated in FIG. 1 includes a magnetoresistance effect element 10 and a magnetic field applying unit 20.

Hereinafter, in explanation of the drawings, a stacking direction of the magnetoresistance effect element 10 is a z direction, an arbitrary direction in an in-plane direction of a plane perpendicular to the z direction is an x direction, and a direction perpendicular to both the x direction and the z direction is a y direction.

<Magnetoresistance Effect Element>

The magnetoresistance effect element 10 includes a first layer (magnetization fixed layer) 11, a second layer (magnetization free layer) 12, and a spacer layer 13. The spacer layer 13 is positioned between the magnetization fixed layer 11 and the magnetization free layer 12. The magnetization of the magnetization fixed layer 11 does not easily move as compared with the magnetization of the magnetization free layer 12 and is fixed in one direction under a predetermined magnetic field environment. The magnetoresistance effect element 10 functions by having a direction of the magnetization of the magnetization free layer 12 change relative to a direction of the magnetization of the magnetization fixed layer 11.

In the following description, a case in which the first layer is the magnetization fixed layer and the second layer is the magnetization free layer as described above will be described as an example. On the other hand, either the first layer or the second layer may not necessarily be a magnetization fixed layer, and both the first layer and the second layer may be magnetization free layers. In this case, either of the first layer or the second layer is a first magnetization free layer, and the other is a second magnetization free layer. Magnetization directions of the first layer and the second layer can be changed relative to each other. A magnetoresistance effect element in which two magnetization free layers are magnetically coupled via a spacer layer can be taken as an example. More specifically, a case in which two magnetization free layers are magnetically coupled via a spacer layer so that magnetization directions of the two magnetization free layers are antiparallel to each other in a state in which no external magnetic field is applied can be exemplified.

The magnetization fixed layer 11 is formed of a ferromagnetic material. The magnetization fixed layer 11 is preferably formed of a high spin polarization material such as Fe, Co, Ni, an alloy of Ni and Fe, an alloy of Fe and Co, or an alloy of Fe, Co and B. When these materials are used, a change rate of magnetoresistance of the magnetoresistance effect element 10 is increased. The magnetization fixed layer 11 may also be formed of a Heusler alloy. A film thickness of the magnetization fixed layer 11 is preferably 1 to 10 nm.

A magnetization fixing method of the magnetization fixed layer 11 is not particularly limited. For example, in order to fix the magnetization of the magnetization fixed layer 11, an antiferromagnetic layer may be added to be in contact with the magnetization fixed layer 11. Further, the magnetization of the magnetization fixed layer 11 may be fixed by utilizing magnetic anisotropy due to a crystal structure, a shape, or the like. For the antiferromagnetic layer, FeO, CoO, NiO, $CuFeS_2$, IrMn, FeMn, PtMn, Cr, Mn, or the like can be used.

The magnetization free layer 12 is formed of a ferromagnetic material of which a direction of magnetization can be changed by an external magnetic field or a spin polarized current.

For the magnetization free layer 12, as a material in a case of having an axis of easy magnetization in an in-plane direction perpendicular to a stacking direction in which the magnetization free layer 12 is stacked, CoFe, CoFeB, CoFeSi, CoMnGe, CoMnSi, CoMnAl, or the like can be used, and as a material in a case of having an axis of easy magnetization in the stacking direction of the magnetization free layer 12, Co, a CoCr-based alloy, a Co multilayer film, a CoCrPt-based alloy, an FePt-based alloy, a SmCo-based alloy or a TbFeCo alloy containing rare earth elements, or the like can be used. Further, the magnetization free layer 12 may also be formed of a Heusler alloy.

A thickness of the magnetization free layer 12 is preferably about 1 to 10 nm. A high spin polarization material may be inserted between the magnetization free layer 12 and the spacer layer 13. When a high spin polarization material is inserted, a high change rate in magnetoresistance can be obtained.

As the high spin polarization material, a CoFe alloy, a CoFeB alloy, or the like can be exemplified. Film thicknesses of both the CoFe alloy and the CoFeB alloy are preferably set to about 0.2 to 1.0 nm.

The spacer layer 13 is a layer disposed between the magnetization fixed layer 11 and the magnetization free layer 12. The spacer layer 13 is formed of a layer formed of a conductor, an insulator, or a semiconductor, or a layer having an electrical conduction point formed by a conductor contained in an insulator. The spacer layer 13 is preferably a nonmagnetic layer.

For example, when the spacer layer 13 is formed of an insulator, the magnetoresistance effect element 10 is a tunneling magnetoresistance (TMR) effect element, and when the spacer layer 13 is formed of a metal, the magnetoresistance effect element 10 is a giant magnetoresistance (GMR) effect element.

When an insulating material is applied for the spacer layer 13, an insulating material such as $Al_2O_3$ or MgO can be used. A high change rate in magnetoresistance can be obtained by adjusting a film thickness of the spacer layer 13 so that a coherent tunneling effect is exhibited between the magnetization fixed layer 11 and the magnetization free layer 12. In order to efficiently utilize a TMR effect, the film thickness of the spacer layer 13 is preferably about 0.5 to 3.0 nm.

When the spacer layer 13 is formed of a conductive material, a conductive material such as Cu, Ag, Au, Ru, or the like can be used. In order to efficiently utilize a GMR effect, a film thickness of the spacer layer 13 is preferably about 0.5 to 3.0 nm.

When the spacer layer 13 is formed of a semiconductor material, a material such as ZnO, $In_2O_3$, $SnO_2$, ITO, $GaO_x$, $Ga_2O_x$, or the like can be used. In this case, a film thickness of the spacer layer 13 is preferably about 1.0 to 4.0 nm.

When a layer having an electrical conduction point formed by a conductor contained in an insulator is applied for the spacer layer 13, a structure having an electrical conduction point formed by a conductor such as CoFe, CoFeB, CoFeSi, CoMnGe, CoMnSi, CoMnAl, Fe, Co, Au, Cu, Al, or Mg contained in an insulator formed of $Al_2O_3$ or MgO is preferable. In this case, a film thickness of the spacer layer 13 is preferably about 0.5 to 2.0 nm.

When a shape of the magnetoresistance effect element 10 in a plan view is a rectangle (including a square), it is preferable that a long side be 300 nm or less in a size of the magnetoresistance effect element 10. When a shape of the magnetoresistance effect element 10 in a plan view is not a rectangle, a long side of a rectangle circumscribing the magnetoresistance effect element 10 with a minimum area in a plan view is defined as a long side of the magnetoresistance effect element 10.

When the long side is as small as about 300 nm, a volume of the magnetization free layer 12 becomes small, and a highly efficient ferromagnetic resonance phenomenon can be realized. Here, the "shape in a plan view" refers to a shape viewed from the stacking direction of each layer constituting the magnetoresistance effect element 10.

<Magnetic Field Applying Unit>

The magnetic field applying unit 20 illustrated in FIG. 1 includes a first ferromagnetic material 21, a second ferromagnetic material 22, and a coil 23. The coil 23 is wound around a protruding portion 21A. The coil 23 induces a magnetic flux, and the induced magnetic flux is concentrated on the protruding portion 21A to form a magnetic field directed toward the facing second ferromagnetic material 22. In FIG. 1, the coil 23 is a spiral coil wound in a spiral shape around the protruding portion 21A. In FIG. 1, the coil 23 has one layer in the z direction, but two or more layers may be stacked.

The first ferromagnetic material 21 and the second ferromagnetic material 22 are formed of a magnetic material. For the first ferromagnetic material 21 and the second ferromagnetic material 22, for example, Fe, Co, Ni, an alloy of Ni and Fe, an alloy of Fe and Co, an alloy of Fe, Co and B, or the like can be used. The coil 23 is formed of a highly conductive wiring pattern, and for example, copper, aluminum, or the like can be used therefor.

The first ferromagnetic material 21 includes a protruding portion 21A protruding from a first surface 21a. The first ferromagnetic material 21 illustrated in FIG. 1 is constituted by the protruding portion 21A, a main portion 21B, and a support portion 21C. The main portion 21B is a main portion of the first ferromagnetic material 21 and is a portion extending in an xy in-plane direction in FIG. 1. The support portion 21C is a portion connecting the first ferromagnetic material 21 with the second ferromagnetic material 22 and is a portion for stabilizing a flow of a magnetic field. The protruding portion 21A is a portion at which lines of magnetic flux flow out from a surface thereof or lines of magnetic flux flow into the surface. Further, lines of magnetic flux flowing out from the protruding portion 21A or lines of magnetic flux flowing therein primarily serve for lines of magnetic flux applied to the magnetization free layer from the first ferromagnetic material and the second ferromagnetic material. Here, "primarily serve for" means playing a major role from a viewpoint of a magnetic field strength (magnetic flux density). The number of protruding portions 21A is not limited to one and may be a plurality thereof. In the example illustrated in FIG. 1, the first surface 21a is a surface of the main portion 21B on the second ferromagnetic material 22 side. A shape of the first surface 21a is not limited.

Figure 2:
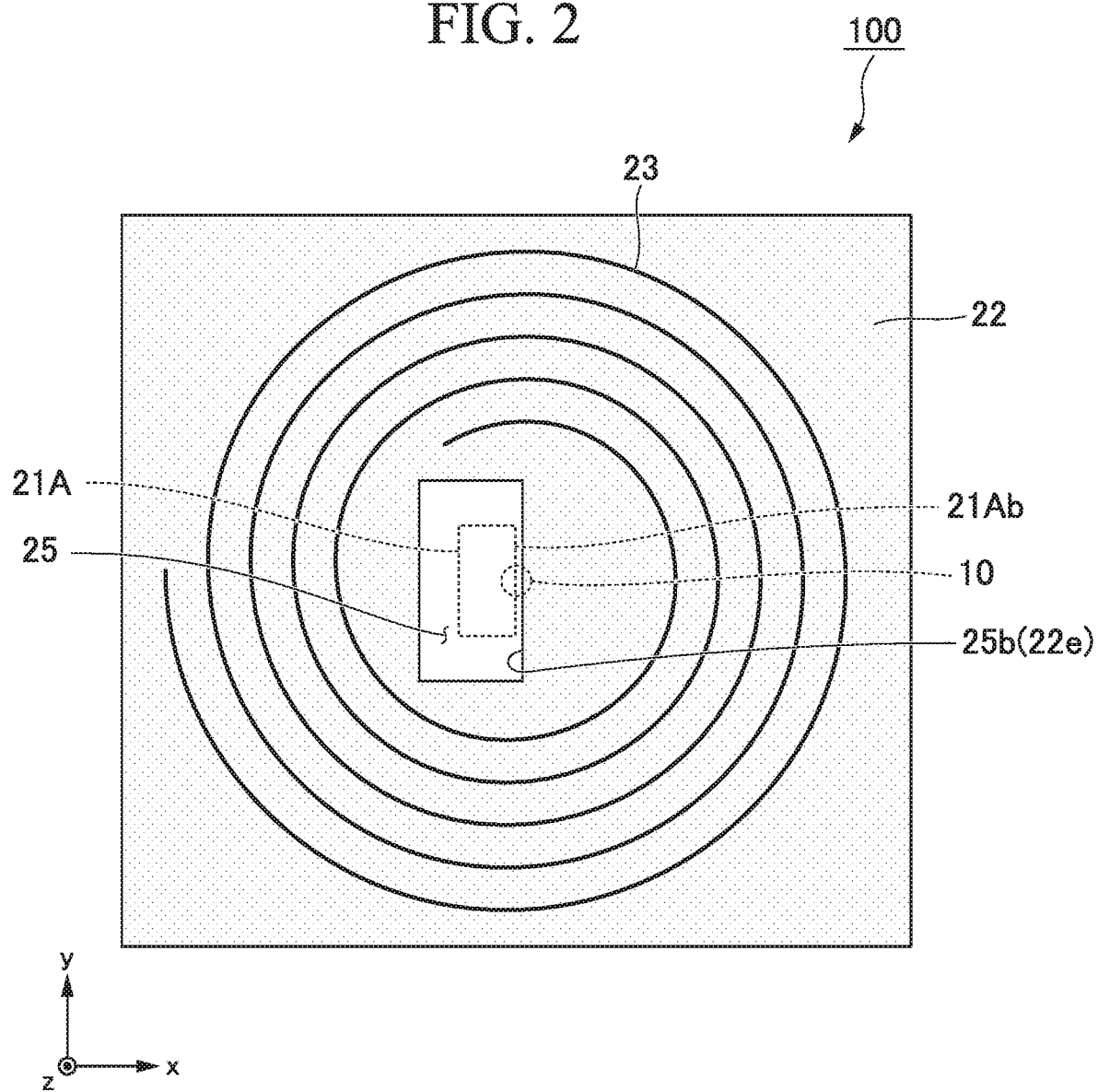
FIG. 2 is a plan view of the magnetoresistance effect device illustrated in FIG. 1.

The second ferromagnetic material 22 is disposed at a position that sandwiches the magnetoresistance effect element 10 together with the first ferromagnetic material 21. The second ferromagnetic material 22 illustrated in FIG. 1 includes an opening portion 25. FIG. 2 is a plan view of the magnetoresistance effect device 100 illustrated in FIG. 1. The opening portion 25 is formed inside the coil 23.

<Positional Relationship Between Magnetoresistance Effect Element 10 and Magnetic Field Applying Unit 20>

The magnetoresistance effect element 10 and the magnetic field applying unit 20 are manufactured by a stacking process in the z direction. Despite having undergone such a stacking process, a magnetic field in an oblique direction can be easily applied to the magnetization free layer 12 with respect to an in-plane direction (xy plane) of the magnetoresistance effect element 10 by controlling a positional relationship between each component of the magnetic field applying unit 20 and the magnetoresistance effect element 10.

The magnetization free layer 12 of the magnetoresistance effect element 10 illustrated in FIG. 1 includes a portion free of overlapping with a second surface 21Aa of the protruding portion 21A and a third surface 22a of the second ferromagnetic material 22 in a plan view when viewed in the z direction. Here, the second surface 21Aa is a surface on the magnetoresistance effect element 10 side in the z direction (stacking direction of the magnetoresistance effect element 10) of the protruding portion 21A (see FIG. 1). The third surface 22a is a surface on the magnetoresistance effect element 10 side in the z direction (stacking direction of the magnetoresistance effect element 10) of the second ferromagnetic material 22 (see FIG. 1). Shapes of the second surface 21Aa and the third surface 22a are not limited. Also, a center of gravity of the magnetization free layer 12 is positioned in a region A connecting the second surface 21Aa and the third surface 22a.

When the magnetization free layer 12 is disposed at a position that satisfies the above-described relationship in regards to the second surface 21Aa and the third surface 22a, a magnetic field directed toward a first end portion 22e of the third surface 22a from a first end portion 21Ae of the second surface 21Aa is mainly applied to the magnetization free layer 12. In the magnetic field applying unit 20 illustrated in FIG. 1, a magnetic field directed toward the first end portion 22e from the first end portion 21Ae is inclined at a predetermined angle with respect to the xy plane. Therefore, the magnetic field applied to the magnetization free layer 12 is in an oblique direction with respect to the in-plane direction (xy plane) of the magnetization free layer 12.

Here, in FIG. 1, the first end portion 21Ae and the first end portion 22e are corner portions on the magnetoresistance effect element 10 side of the protruding portion 21A and the second ferromagnetic material 22 in a cross section taken along a plane including a line segment passing through centers of gravity of the protruding portion 21A and the magnetization free layer 12. Here, in FIG. 1, each of the first end portion 21Ae and the first end portion 22e is illustrated as a corner portion at which two line segments are perpendicular to each other. However, there are cases in which the second surface 21Aa and a side surface of the protruding portion 21A are connected by a gentle curved surface in an actual element. In this case, a portion at which an inclination angle of a tangent at the curved surface with respect to the in-plane direction (xy plane) is 10 degrees is referred to as a boundary between the second surface 21Aa and the side surface. The same applies to the third surface 22a.

The magnetoresistance effect device 100 illustrated in FIG. 1 is an embodiment for applying a magnetic field from an oblique direction to the in-plane direction of the magnetization free layer 12, but it is not necessary to have this configuration. For example, the magnetoresistance effect device 100 illustrated in FIG. 1 may has a structure in which the magnetization free layer 12 has a portion that overlaps neither the second surface 21Aa nor the third surface 22a in a plan view when viewed in the z direction, but a magnetoresistance effect device may have a configuration in which the magnetization free layer 12 has a portion that is free of overlapping with only one of the surfaces.

Figure 3A:
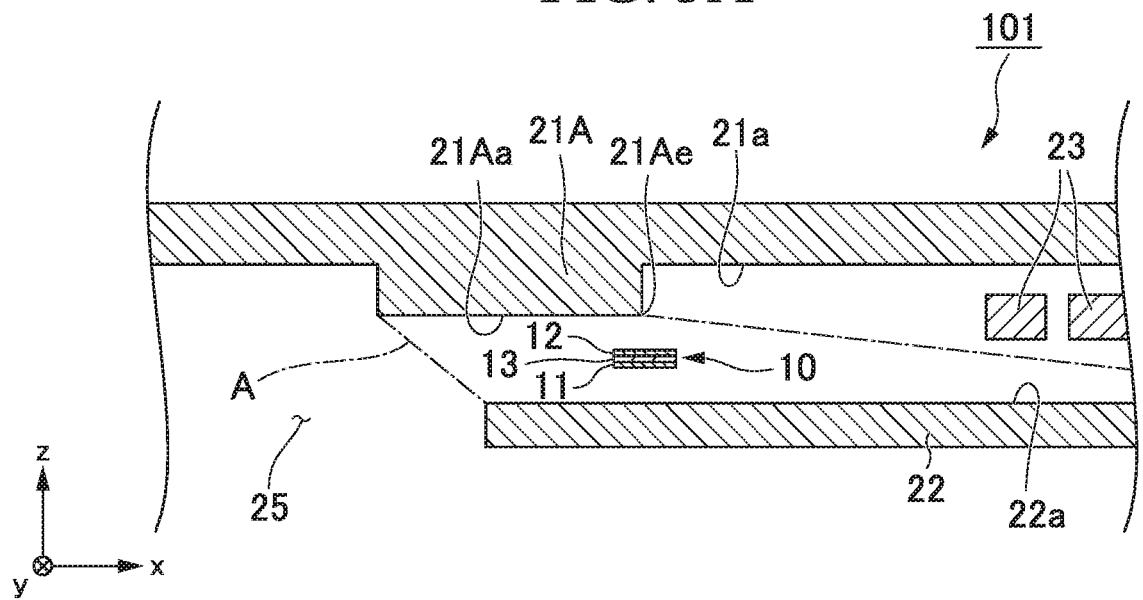
FIG. 3A is a schematic cross-sectional view in which a main portion of another example of the magnetoresistance effect device according to the first embodiment is enlarged.
Figure 3B:
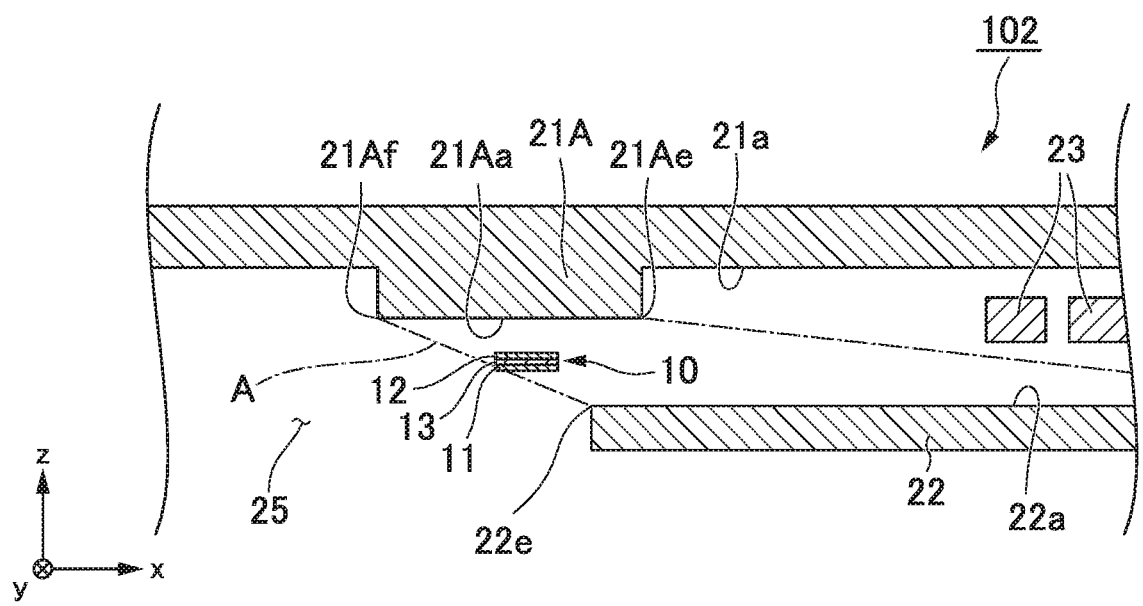
FIG. 3B is a schematic cross-sectional view in which a main portion of another example of the magnetoresistance effect device according to the first embodiment is enlarged.

FIG. 3 is a schematic cross-sectional view in which a main portion of another example of the magnetoresistance effect device according to the present embodiment is enlarged. The magnetization free layer 12 in a magnetoresistance effect device 101 illustrated in FIG. 3A has a portion free of overlapping with the second surface 21Aa, but overlaps the third surface 22a over the entire surface in a plan view when viewed in the z direction. On the contrary, the magnetization free layer 12 in a magnetoresistance effect device 102 illustrated in FIG. 3B overlaps the second surface 21Aa over the entire surface, but is free of overlapping with the third surface 22a in a plan view when viewed in the z direction. Further, a center of gravity of the magnetization free layer 12 is positioned within the region A connecting the second surface 21Aa and the third surface 22a in both FIG. 3A and FIG. 3B.

In the magnetoresistance effect device 101 illustrated in FIG. 3A, magnetic flux lines flowing out from the first end portion 21Ae of the second surface 21Aa flow into the third surface 22a of the second ferromagnetic material 22. An area of the second surface 21Aa is smaller than an area of the third surface 22a. Therefore, the magnetic flux lines are formed in a direction extending from the first end portion 21Ae toward the third surface 22a. The magnetic field extending from the first end portion 21Ae toward the third surface 22a has a component inclined with respect to the xy plane. Therefore, also in the magnetoresistance effect device 101 illustrated in FIG. 3A, a magnetic field can be applied to the magnetization free layer 12 in an oblique direction.

Further, also in the magnetoresistance effect device 102 illustrated in FIG. 3B, a leakage magnetic field between the second surface 21Aa and the third surface 22a is strongly generated in the region A connecting the second surface 21Aa and the third surface 22a. For example, magnetic flux lines flowing out from a second end portion 21Af on a side opposite to the first end portion 21Ae in FIG. 3B flow into the third surface 22a of the second ferromagnetic material 22. Under the condition that a center of gravity of the magnetization free layer 12 is within the region A, when the magnetization free layer 12 and the third surface 22a are disposed not to overlap each other when viewed in the z direction, magnetic flux lines generated in the region A connecting the second surface 21Aa and the third surface 22a are applied to the magnetization free layer 12. Therefore, also in the magnetoresistance effect device 101 illustrated in FIG. 3B, a magnetic field can be applied to the magnetization free layer 12 in an oblique direction.

Also, in order to control an angle (application angle) formed between the in-plane direction (xy plane) of the magnetization free layer 12 and a direction in which the magnetic field is applied, it is preferable to control a positional relationship between a first perpendicular line C1 extending in the z-direction through a center of gravity of the magnetization free layer 12, the protruding portion 21A, and the opening portion 25.

FIGS. 4A, 4B, 5A and 5B are schematic cross-sectional views in each of which a main portion of another example of the magnetoresistance effect device according to the present embodiment is enlarged. In a magnetoresistance effect device 103 illustrated in FIG. 4A, the first perpendicular line C1 overlaps the second surface 21Aa and the third surface 22a in a plan view when viewed in the z direction. In a magnetoresistance effect device 104 illustrated in FIG. 4B, the first perpendicular line C1 is free of overlapping with the second surface 21Aa and overlaps the third surface 22a in a plan view when viewed in the z direction. In a magnetoresistance effect device 105 illustrated in FIG. 5A, the first perpendicular line C1 overlaps the second surface 21Aa and is free of overlapping with the third surface 22a in a plan view when viewed in the z direction. In a magnetoresistance effect device 106 illustrated in FIG. 5B, the first perpendicular line C1 overlaps neither the second surface 21Aa nor the third surface 22a in a plan view when viewed in the z direction.

When the first perpendicular line C1 overlaps the second surface 21Aa and the third surface 22a in a plan view when viewed in the z direction (FIG. 4A), since the magnetoresistance effect element 10 is disposed at a position at which a distance between the second surface 21Aa and the third surface 22a is the shortest (a position on a perpendicular line descending from the second surface 21Aa to the third surface 22a), an application angle of a magnetic field is close to 90°. Since the magnetization free layer 12 has a portion not overlapping the second surface 21Aa when viewed in the z direction, the application angle is not actually 90°.

Further, when the first perpendicular line C1 is free of overlapping with the second surface 21Aa in a plan view when viewed in the z direction (FIG. 4B), the magnetization free layer 12 is disposed at a position deviating from a position at which a distance between the second surface 21Aa and the third surface 22a is the shortest (a position on a perpendicular line descending from the second surface 21Aa to the third surface 22a). Therefore, the application angle can be made smaller than that in the case of FIG. 4A, and a larger magnetic field in an oblique direction can be applied to the magnetization free layer 12.

Further, when the first perpendicular line C1 is free of overlapping with the third surface 22a in a plan view when viewed in the z direction (FIG. 5A), a shortest distance between the second surface 21Aa and the third surface 22a is inclined with respect to the xy plane. That is, a component in an oblique direction of the leakage magnetic field generated between the second surface 21Aa and the third surface 22a increases. Therefore, the application angle can be made smaller than that in the case of FIG. 4A, and a larger magnetic field in an oblique direction can be applied to the magnetization free layer 12.

Figure 4A:
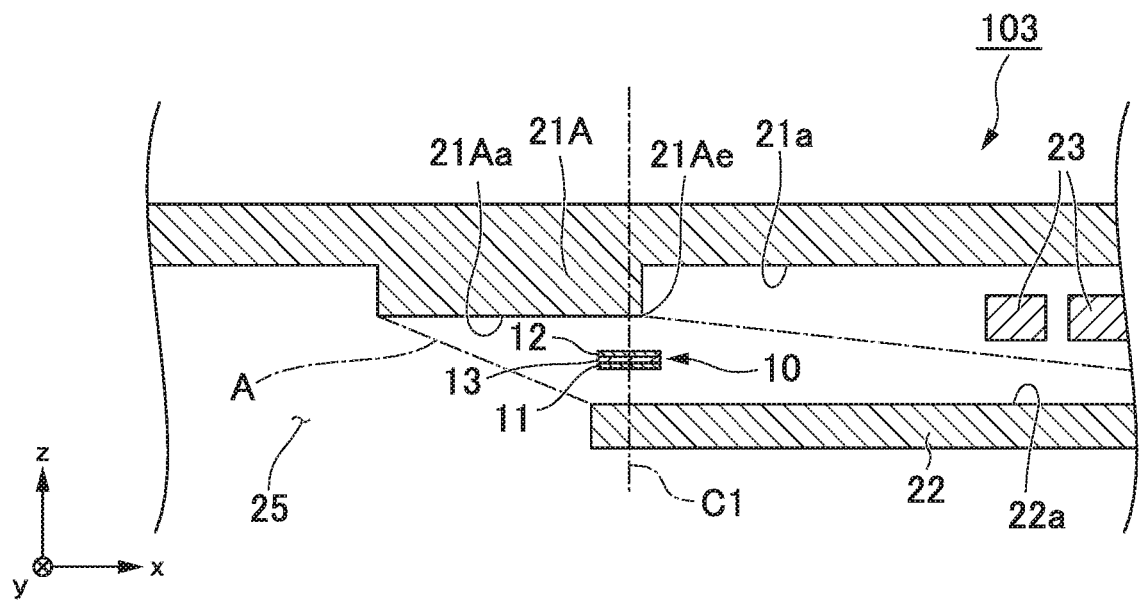
FIG. 4A is a schematic cross-sectional view in which a main portion of another example of the magnetoresistance effect device according to the first embodiment is enlarged.
Figure 4B:
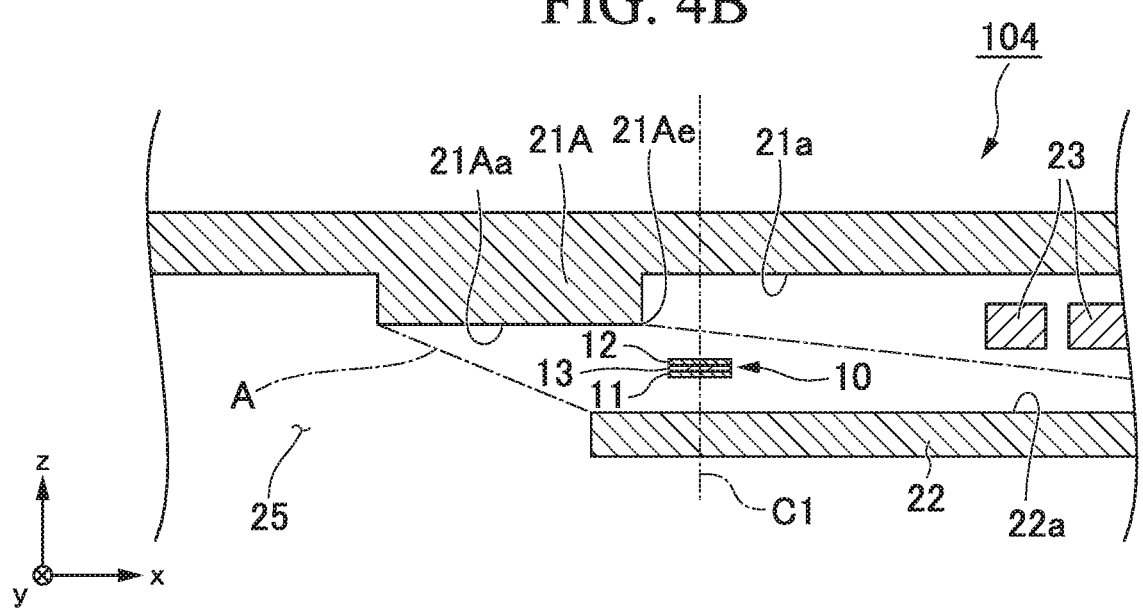
FIG. 4B is a schematic cross-sectional view in which a main portion of another example of the magnetoresistance effect device according to the first embodiment is enlarged.
Figure 5A:
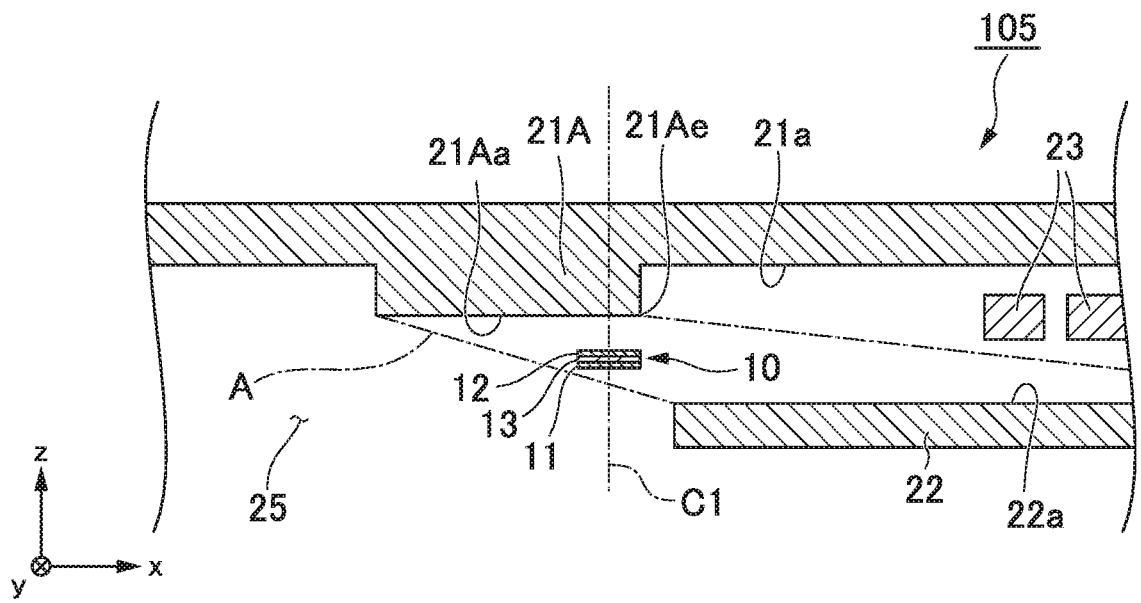
FIG. 5A is a schematic cross-sectional view in which a main portion of another example of the magnetoresistance effect device according to the first embodiment is enlarged.
Figure 5B:
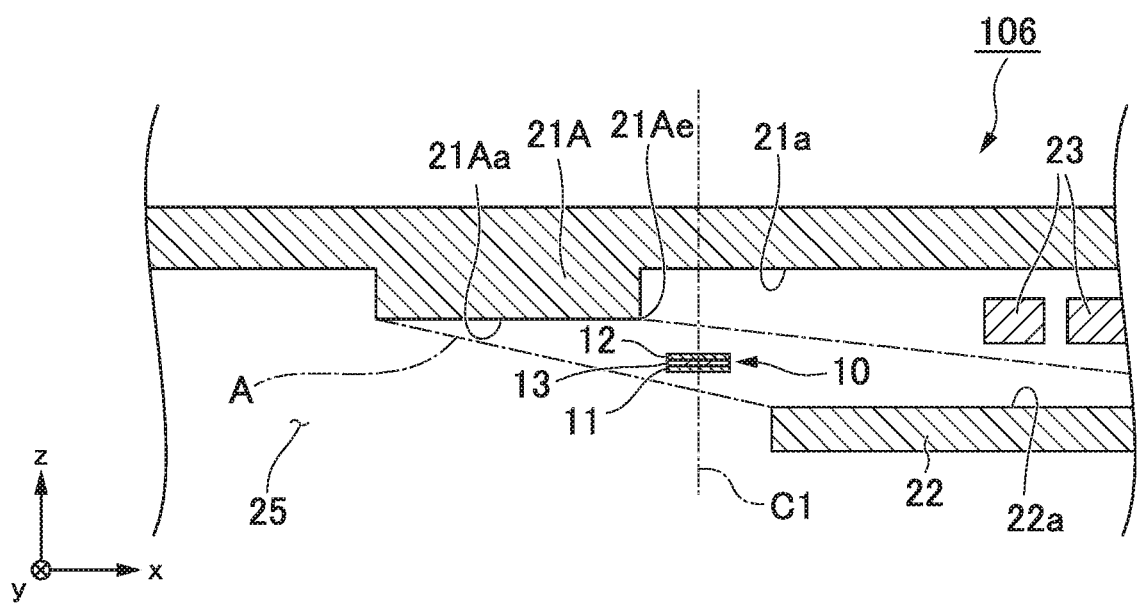
FIG. 5B is a schematic cross-sectional view in which a main portion of another example of the magnetoresistance effect device according to the first embodiment is enlarged.

Finally, when the first perpendicular line C1 is free of overlapping with the second surface 21Aa and the third surface 22a in a plan view when viewed in the z direction (FIG. 5B), since this conforms to the configurations of both FIG. 4B and FIG. 5A, the application angle can be further decreased. As a result, an application angle of the magnetic field to the magnetization free layer 12 can be decreased to about 45°.

In addition to the positional relationship between the first perpendicular line C1, the protruding portion 21A, and the opening portion 25, an application angle of the magnetic field with respect to the magnetization free layer 12 may be controlled according to a distance (d1) between the second surface 21Aa and the third surface 22a in the z direction, and a distance (d2) between the first end portion 21Ae of the second surface 21Aa and the first end portion 22e of the third surface 22a in a perpendicular direction (for example, x direction) that is perpendicular to the z direction. By adjusting the relationship between these distances, it is possible to freely set an angle (application angle) formed between the in-plane direction (xy plane) of the magnetoresistance effect element 10 and a direction in which a magnetic field is applied to the magnetization free layer 12. In order to cause the application angle to fall within a range of 45° to 80°, it is preferable that |d2/d1|≤2.5 be satisfied.

Figure 6A:
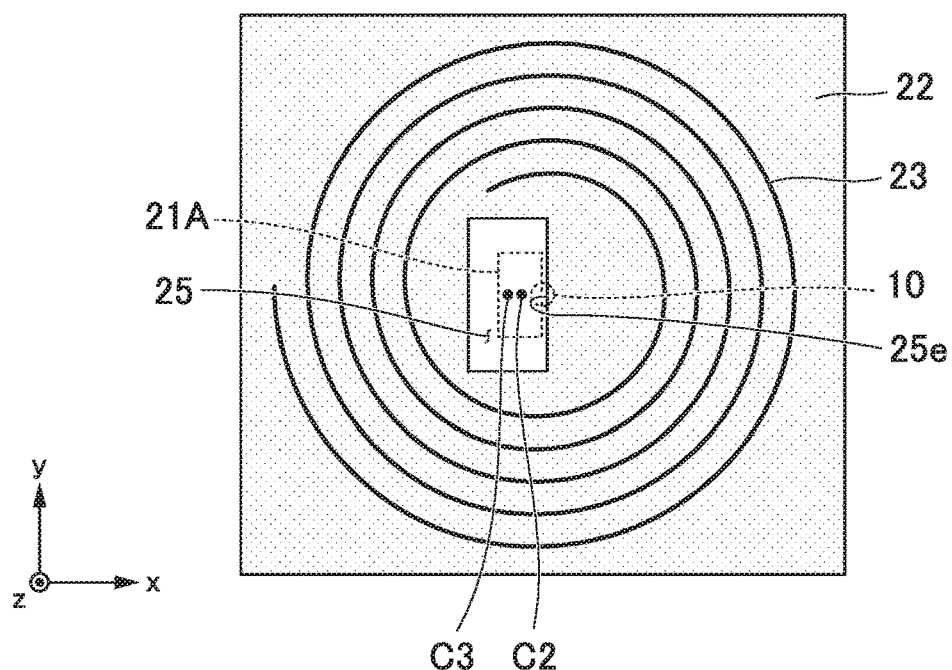
FIG. 6A is an example of the magnetoresistance effect device according to the first embodiment and is a plan view of an example in which a positional relationship between a center of gravity position of a protruding portion, a center of gravity position of an opening portion, and a first end portion is changed.
Figure 6B:
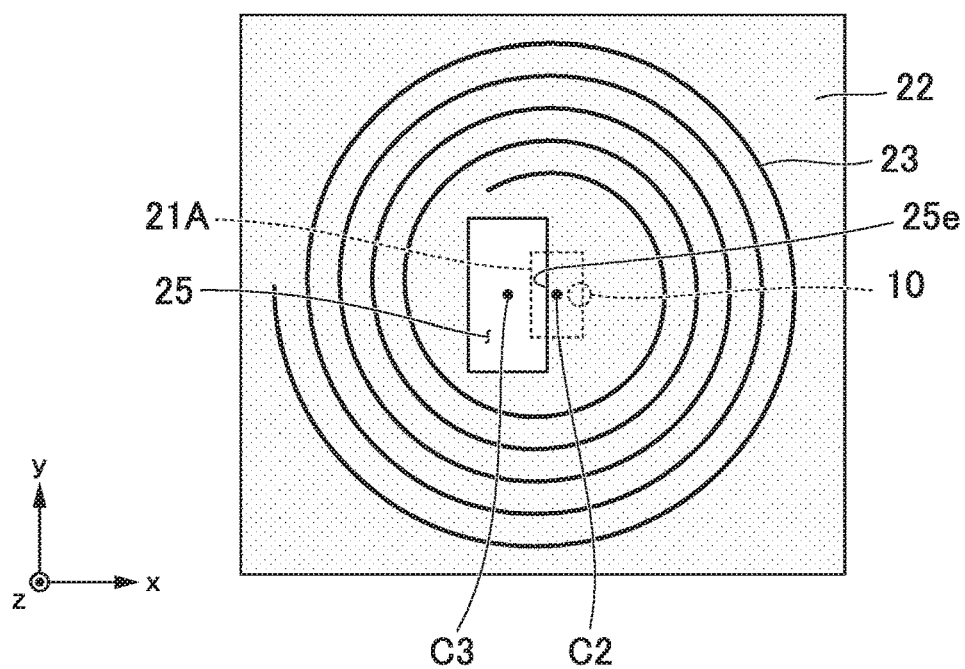
FIG. 6B is an example of the magnetoresistance effect device according to the first embodiment and is a plan view of an example in which a positional relationship between a center of gravity position of a protruding portion, a center of gravity position of an opening portion, and a first end portion is changed.
Figure 7A:
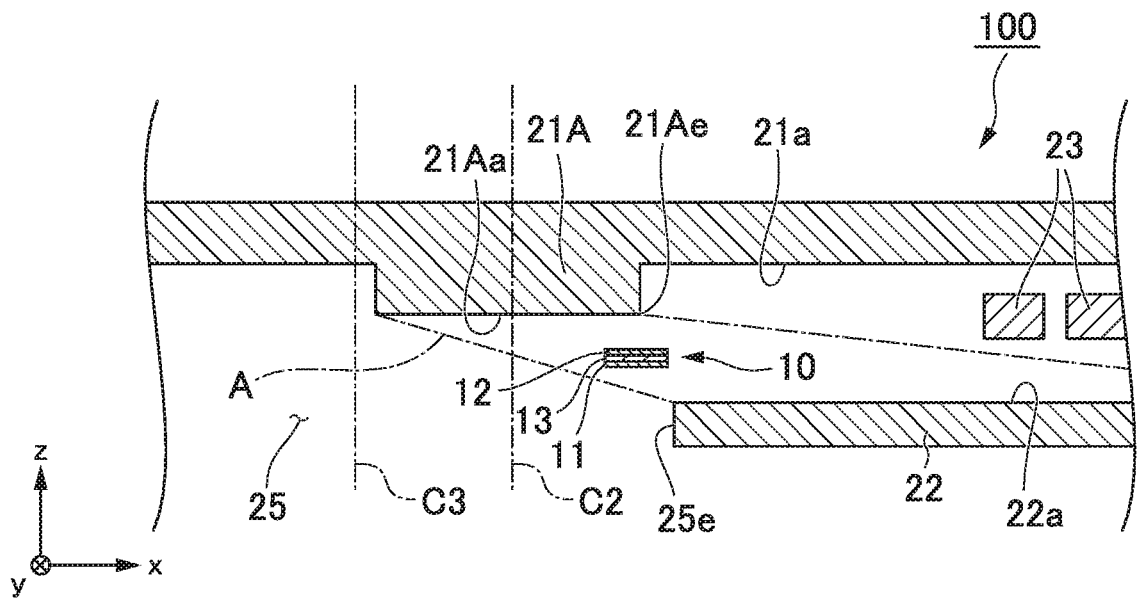
FIG. 7A is an example of the magnetoresistance effect device according to the first embodiment and is a schematic cross-sectional view of an example in which a positional relationship between a center of gravity position of the protruding portion, a center of gravity position of the opening portion, and the first end portion is changed.
Figure 7B:
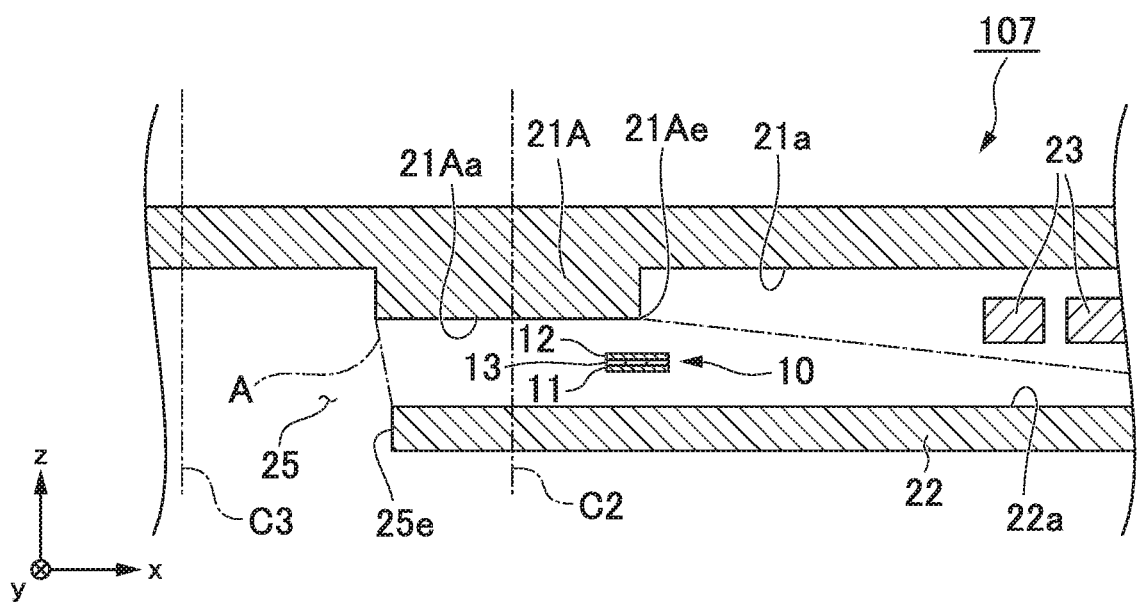
FIG. 7B is an example of the magnetoresistance effect device according to the first embodiment and is a schematic cross-sectional view of an example in which a positional relationship between a center of gravity position of the protruding portion, a center of gravity position of the opening portion, and the first end portion is changed.

Besides these relationships, an application angle may be controlled by controlling a positional relationship between a center of gravity C2 of the protruding portion 21A and a center of gravity C3 of the opening portion 25, and a positional relationship between these and the first end portion 22e. Further, the center of gravity of the opening portion 25 means a position of a center of gravity when the opening portion 25 is filled with a uniform medium. FIGS. 6A, 6B, 7A and 7B illustrate examples of the magnetoresistance effect devices according to the present embodiment, and illustrate an example in which a positional relationship between the center of gravity C2 of the protruding portion 21A and the center of gravity C3 of the opening portion 25 and a positional relationship between these and the first end portion 22e are changed. FIGS. 6A and 6B are plan views when viewed in the z direction, and FIGS. 7A and 7B are schematic views taken along a plane passing through the center of gravity C2 of the protruding portion 21A and the center of gravity of the magnetization free layer 12.

In both of the magnetoresistance effect devices 100 and 107 illustrated in FIGS. 6A, 6B, 7A and 7B, the center of gravity C3 of the opening portion 25 is positioned on a side opposite to the magnetoresistance effect element 10 with respect to the center of gravity C2 of the protruding portion 21A. Here, "positioned on an opposite side" means that the center of gravity C3 of the opening portion 25 and the magnetoresistance effect element 10 are in different regions when partitioned by a straight line perpendicular to a line segment connecting the center of gravity C3 of the opening portion 25 and the magnetoresistance effect element 10 and passing through the center of gravity C2 of the protruding portion 21A. On the other hand, in the magnetoresistance effect device 100 illustrated in FIGS. 6A and 7A, an end portion 25e of the opening portion 25 (first end portion 22e of the third surface 22a) is on the magnetoresistance effect element 10 side with respect to the center of gravity C2 of the protruding portion 21A, whereas, in the magnetoresistance effect device 107 illustrated in FIGS. 6B and 7B, the end portion 25e of the opening portion 25 is on a side opposite to the magnetoresistance effect element 10 with respect to the center of gravity C2 of the protruding portion 21A.

In the magnetoresistance effect device 100 illustrated in FIGS. 6A and 7A, the end portion 25e of the opening portion 25 is close to the magnetoresistance effect element 10 side. Therefore, it is easy to have a configuration in which the magnetoresistance effect element 10 and the third surface 22a do not overlap when viewed in the z direction. That is, a component in an oblique direction of the magnetic field applied to the magnetoresistance effect element 10 can be increased. Further, when the protruding portion 21A is disposed to be enclosed in the opening portion 25 when viewed in the z direction, a component in an oblique direction of the magnetic field applied to the magnetoresistance effect element 10 can be further increased.

As described above, in the magnetoresistance effect devices 100 to 107 exemplified in the present embodiment, the magnetic field applying unit 20 includes the protruding portion 21A and the opening portion 25, and a positional relationship between these and the magnetoresistance effect element 10 is controlled. Therefore, in spite of the fact that the magnetoresistance effect element 10 and the magnetic field applying unit 20 are manufactured by a stacking process in the z direction, a magnetic field can be applied to the in-plane direction (xy plane) of the magnetization free layer 12 in an oblique direction.

While embodiments of the present disclosure have been described above in detail with reference to the accompanying drawings, the respective configurations and combinations thereof in the respective embodiments are merely examples, and additions, omissions, substitutions, and other changes to the configurations are possible without departing from the spirit of the present disclosure.

Figure 8A:
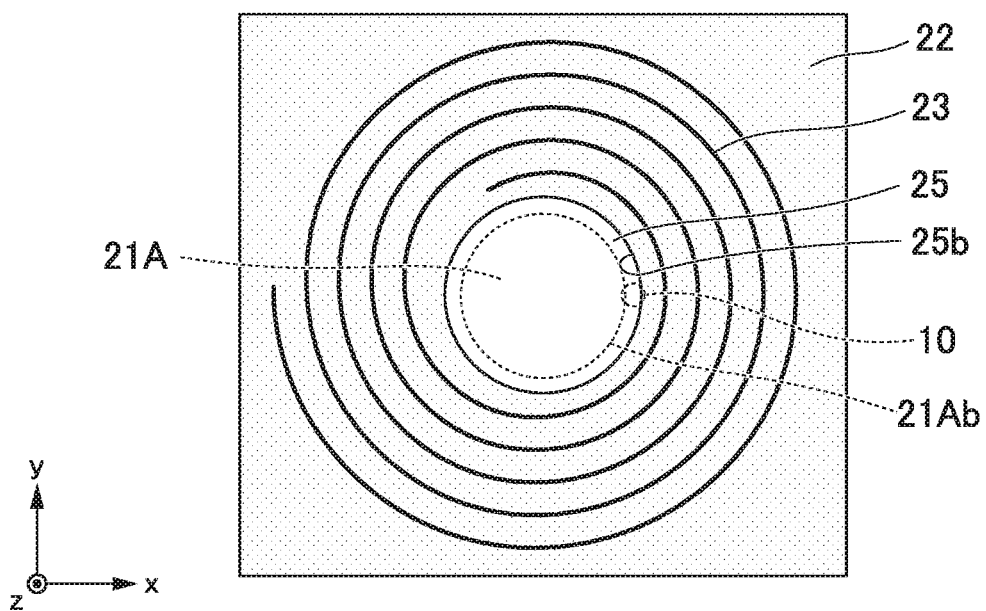
FIG. 8A is a schematic plan view of another example of the magnetoresistance effect device according to the first embodiment.
Figure 8B:
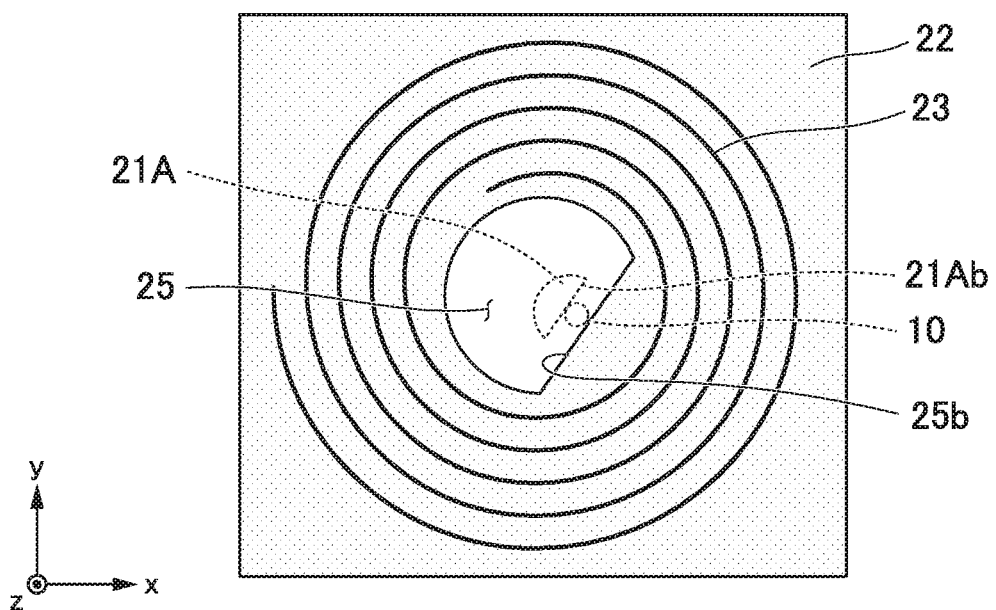
FIG. 8B is a schematic plan view of another example of the magnetoresistance effect device according to the first embodiment.

For example, shapes of the protruding portion 21A and the opening portion 25 in a plan view when viewed in the z direction are not limited to a rectangle as illustrated in FIG. 2. FIGS. 8A and 8B are schematic views illustrating another example of the magnetoresistance effect device in a plan view when viewed in the z direction. Shapes of the protruding portion 21A and the opening portion 25 in a plan view may be circular as illustrated in FIG. 8A, or may be semilunar as illustrated in FIG. 8B. In addition, shapes of these in a plan view may be an elliptical, a polygonal, or the like. Further, as illustrated in FIG. 8B, the protruding portion 21A and the opening portion 25 may not be similar in shape.

In shapes of the protruding portion 21A and the opening portion 25 in a plan view, a first side surface 25b of the opening portion 25 and a second side surface 21Ab of the protruding portion 21A are preferably parallel to each other. Here, the first side surface 25b and the second side surface 21Ab are side surfaces on a side sandwiching the magnetoresistance effect element 10 in a plan view when viewed in the z direction. As illustrated in FIG. 8A, when the protruding portion 21A and the opening portion 25 have a circular shape in a plan view, a semicircle on the magnetoresistance effect element 10 side corresponds to the first side surface 25b and the second side surface 21Ab. That is, "parallel" may refer to either a parallel straight line or a parallel curve.

When the first side surface 25b and the second side surface 21Ab are parallel to each other, a magnetic field distribution formed between the first side surface 25b and the second side surface 21Ab is made uniform. The magnetic field is formed between the protruding portion 21A and the second ferromagnetic material 22. When the first side surface 25b and the second side surface 21Ab are parallel to each other, a distance between the first side surface 25b and the second side surface 21Ab is constant. Therefore, a magnetic field strength between them becomes constant. That is, when the magnetoresistance effect element 10 is provided at any position between them, the magnetic field strength applied to the magnetoresistance effect element 10 is constant and positional accuracy of the magnetoresistance effect element 10 can be eased.

Also, as illustrated in FIGS. 2 and 8B, the first side surface 25b and the second side surface 21Ab are preferably straight lines. When these side surfaces are straight lines in a plan view, a magnetic field strength between the first side surface 25b and the second side surface 21Ab can be made more constant.

Figure 9:
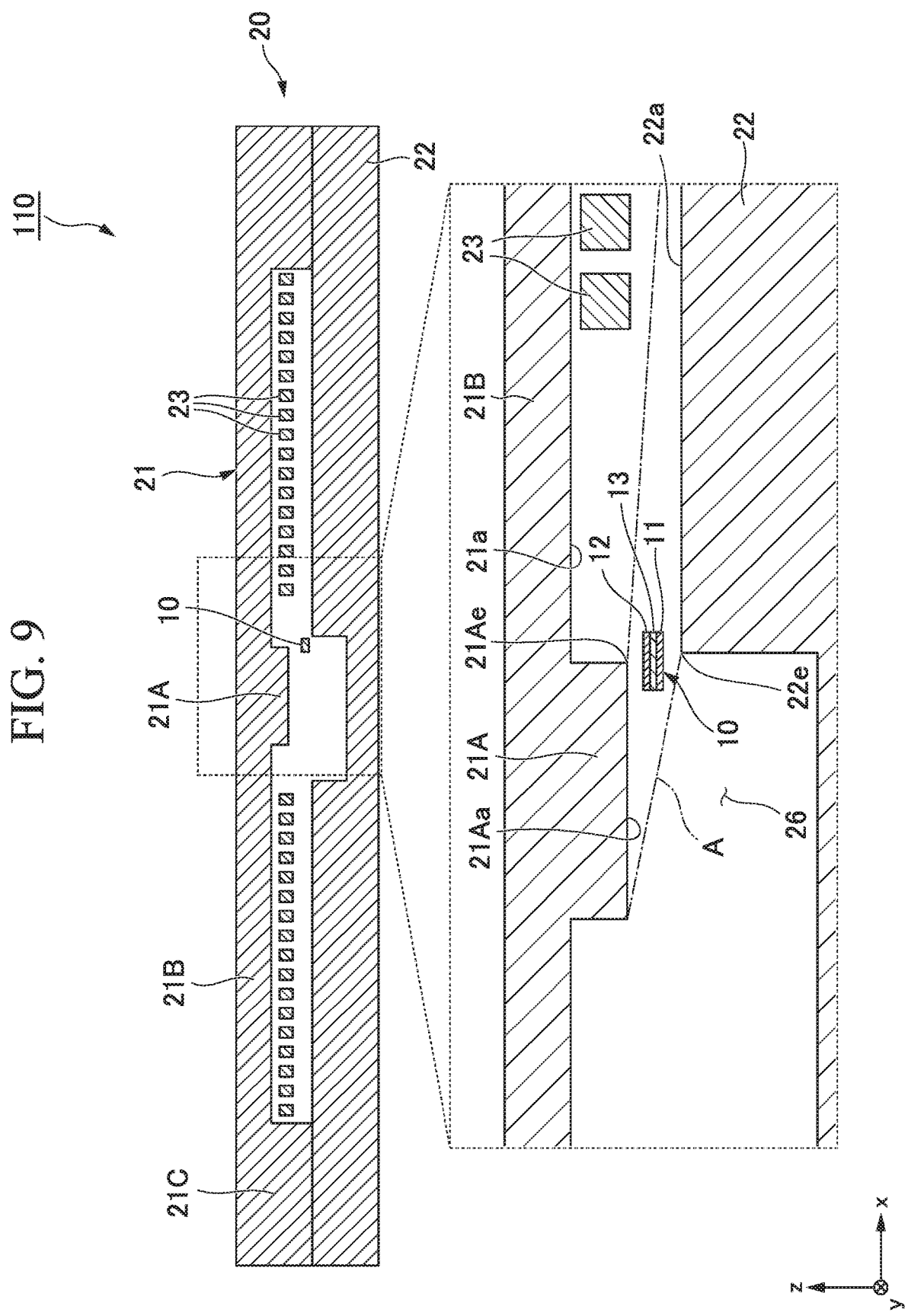
FIG. 9 is a schematic cross-sectional view of the magnetoresistance effect device in which a second ferromagnetic material includes a recessed portion.

Also, in the magnetoresistance effect device according to the above-described embodiment, the second ferromagnetic material 22 has the opening portion 25, but, instead of the opening portion 25, as in a magnetoresistance effect device 110 illustrated in FIG. 9, a recessed portion 26 recessed from the third surface 22a toward a side opposite to the magnetoresistance effect element 10 may be provided. Further, a center of gravity of the recessed portion 26 is caused to be at a position of a center of gravity when the recessed portion 26 is filled with a uniform medium as in the opening portion 25.

Magnetic flux lines between the first ferromagnetic material 21 and the second ferromagnetic material 22 are concentrated between the second surface 21Aa and the third surface 22a. Therefore, even when the opening portion 25 is replaced by the recessed portion 26, a flow of the magnetic flux lines does not change greatly. That is, the magnetoresistance effect device 110 illustrated in FIG. 9 can apply a magnetic field in an oblique direction to the magnetization free layer 12. Further, in a preferred configuration for controlling an angle (application angle) formed by the in-plane direction (xy plane) of the magnetization free layer 12 and a direction in which a magnetic field is applied, a similar configuration can be selected by replacing the "opening portion 25" with the "recessed portion 26."

Figure 10:
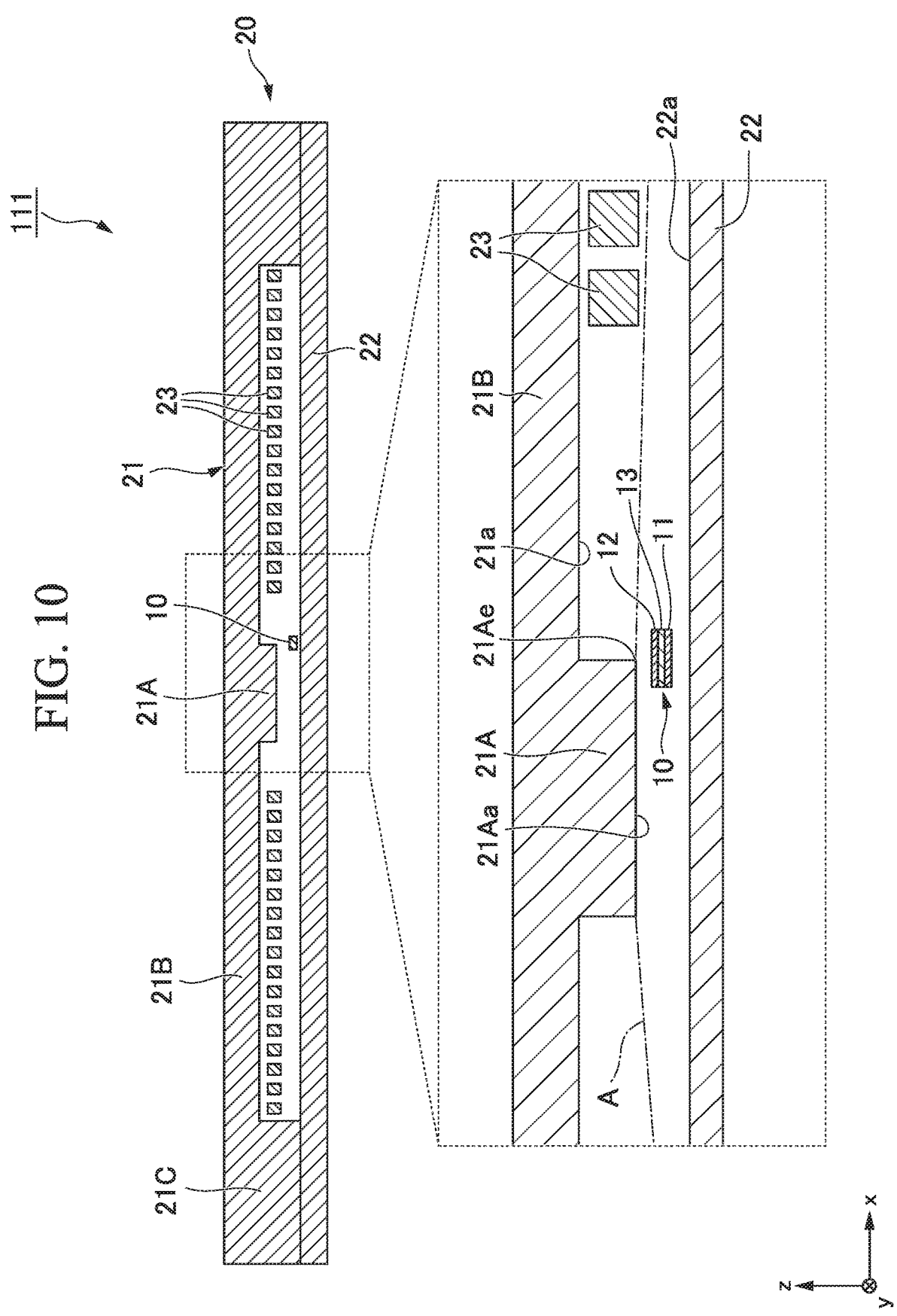
FIG. 10 is a cross-sectional schematic view of another example of the magnetoresistance effect device in which the second ferromagnetic material includes neither an opening portion nor a recessed portion.

Further, the second ferromagnetic material 22 may not have the opening portion 25 or the recessed portion 26. FIG. 10 is a cross-sectional view schematically illustrating an example of a magnetoresistance effect device 111 having neither a recessed portion nor an opening portion. In this case, the magnetoresistance effect element 10 and the third surface 22a of the second ferromagnetic material 22 always overlap in a plan view when viewed in the z direction. Therefore, the magnetization free layer 12 of the magnetoresistance effect element 10 needs to have a portion that is free of overlapping with the second surface 21Aa of the protruding portion 21A in a plan view when viewed in the z direction.

An area of the second surface 21Aa is smaller than an area of the third surface 22a. Therefore, magnetic flux lines extend from the second surface 21Aa toward the third surface 22a. That is, a leakage magnetic field between the second surface 21Aa and the third surface 22a is generated within a region A connecting the second surface 21Aa and the third surface 22a.

A magnetic field applied to a portion of the magnetoresistance effect element 10 not overlapping the second surface 21Aa in a plan view when viewed in the z direction is a magnetic field generated to extend from the second surface 21Aa toward the third surface 22a. This magnetic field has a component oblique to the xy plane. Therefore, also in the magnetoresistance effect device 111 illustrated in FIG. 10, a magnetic field can be applied to the magnetization free layer 12 in an oblique direction.

Figure 11:
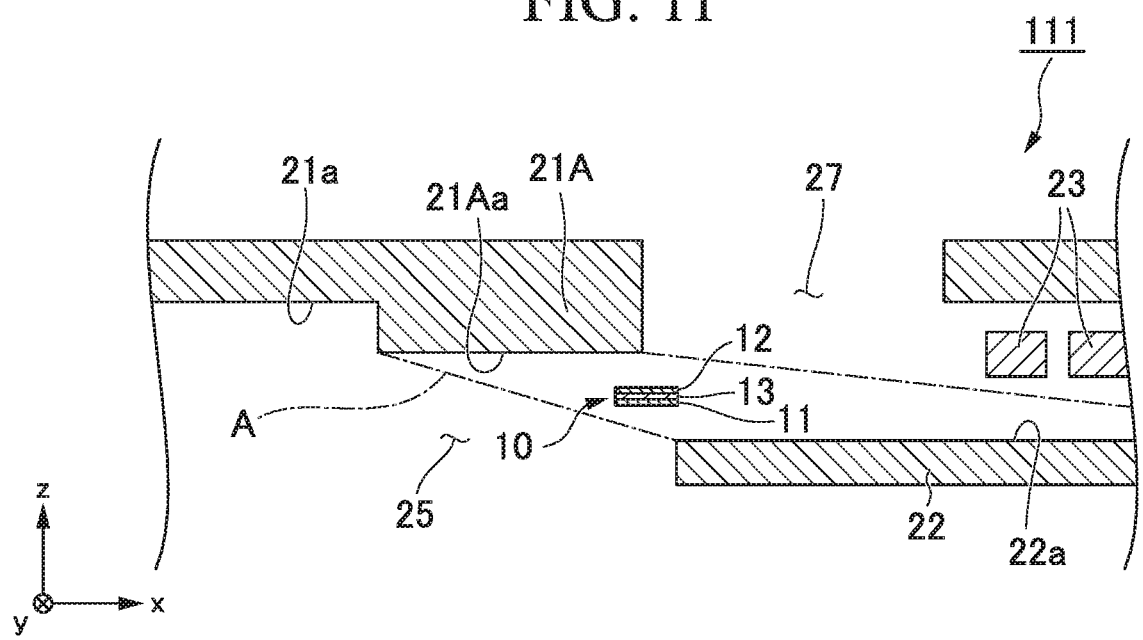
FIG. 11 is a schematic cross-sectional view of the magnetoresistance effect device in which a first ferromagnetic material includes a second opening portion.
Figure 12:
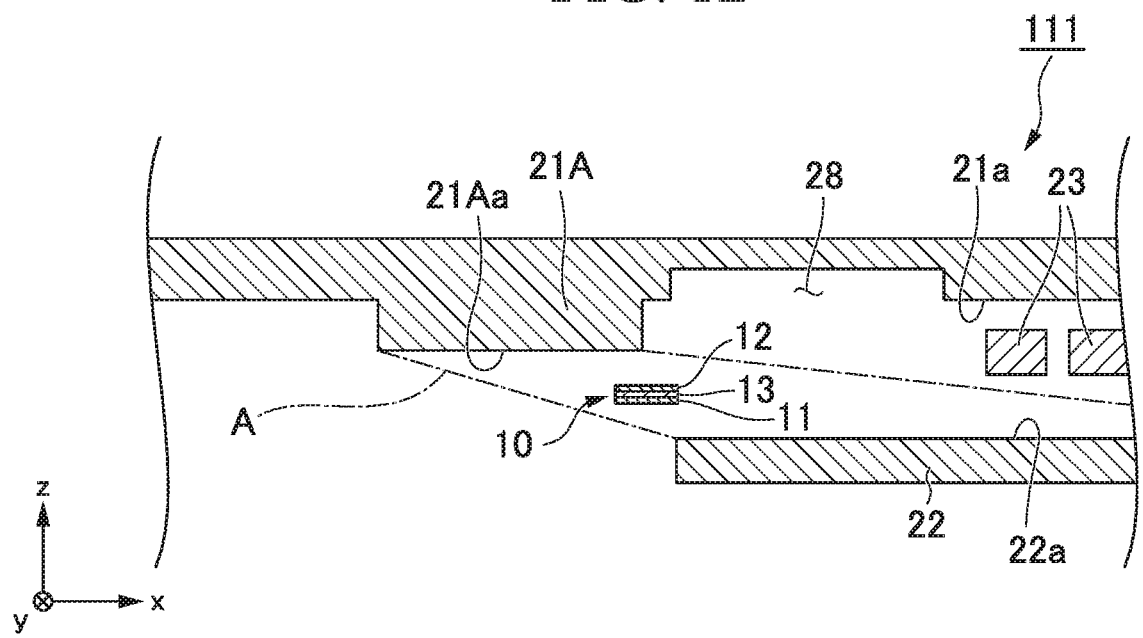
FIG. 12 is a schematic cross-sectional view of the magnetoresistance effect device in which the first ferromagnetic material includes a second recessed portion.

FIGS. 11 and 12 are views schematically illustrating another example of the magnetoresistance effect device according to the present embodiment. The magnetoresistance effect device illustrated in FIG. 11 is different from the magnetoresistance effect device 100 illustrated in FIG. 1 in that the first ferromagnetic material 21 has a second opening portion 27 on an outer side of the protruding portion 21A. Also, the magnetoresistance effect device illustrated in FIG. 12 is different from the magnetoresistance effect device 100 illustrated in FIG. 1 in that the first ferromagnetic material 21 has a second recessed portion 28 recessed from the first surface 21a toward a side opposite to the magnetoresistance effect element 10. Both the second opening portion 27 and the second recessed portion 28 are provided inside the coil 23 when viewed in the z direction.

When the first ferromagnetic material 21 has the second opening portion 27 or the second recessed portion 28, a magnetic field distribution in the vicinity of the magnetoresistance effect element 10 becomes uniform, and a magnetic field can be applied to the magnetoresistance effect element 10 at a desired application angle. The reason for this is thought to be that a flow of magnetic flux lines becomes constant due to decreased amount of a magnetic material disposed in the vicinity of the magnetoresistance effect element 10.

Figure 13A:
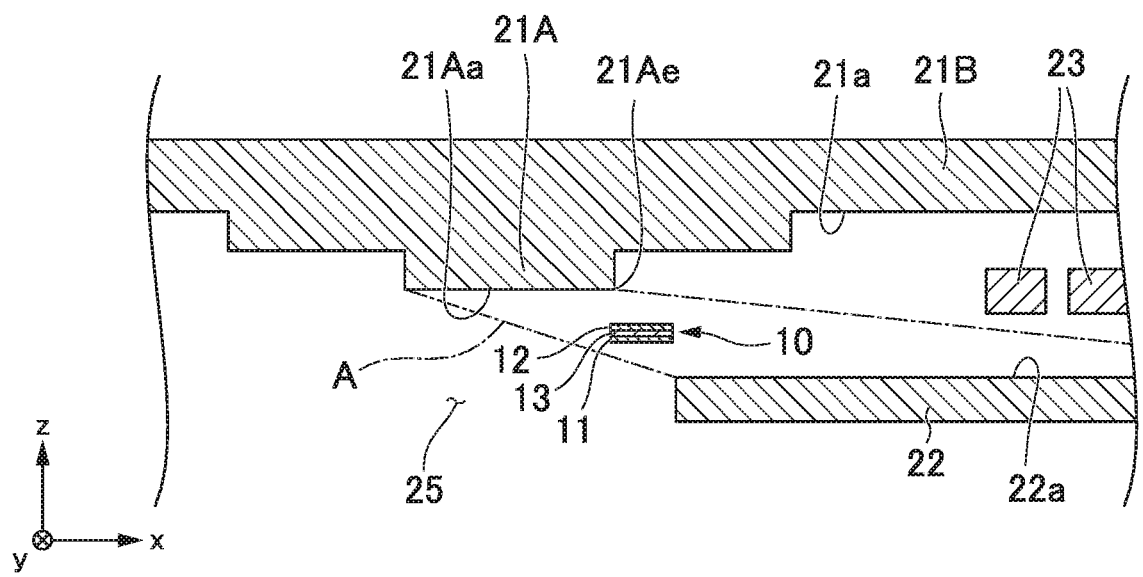
FIG. 13A is an example of the magnetoresistance effect device according to the first embodiment and is a schematic cross-sectional view illustrating an enlarged main portion of an example in which a multi-stepped protruding structure is provided.
Figure 13B:
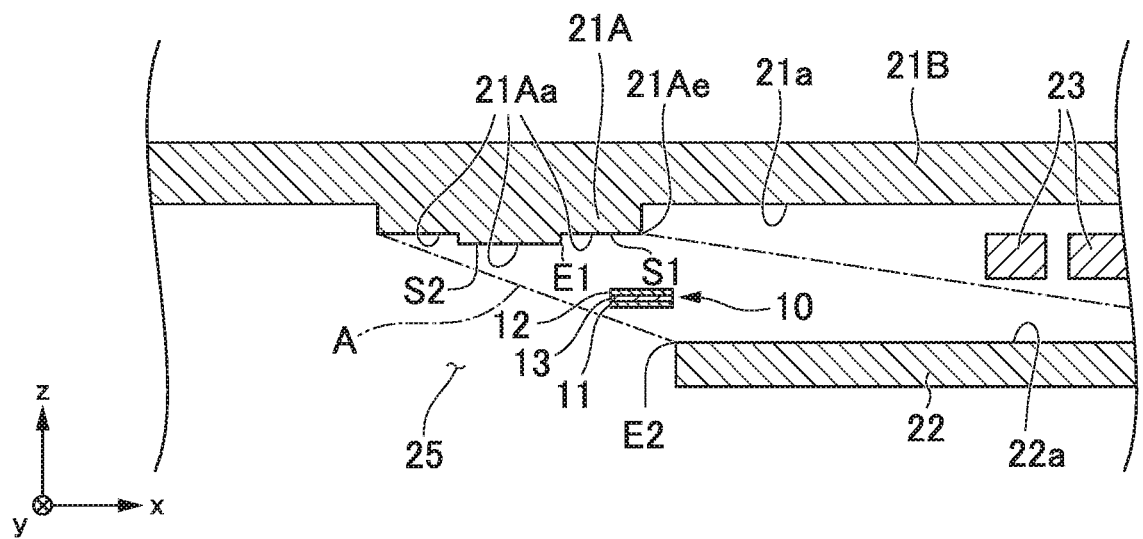
FIG. 13B is an example of the magnetoresistance effect device according to the first embodiment and is a schematic cross-sectional view illustrating an enlarged main portion of an example in which a multi-stepped protruding structure is provided.

FIGS. 13A and 13B are views schematically illustrating another example of the magnetoresistance effect device according to the present embodiment. The magnetoresistance effect device illustrated in FIGS. 13A and 13B includes a protruding structure having two steps in a central portion. In a case of FIG. 13A, a density of magnetic flux lines applied to the magnetization free layer 12 from a first step (on a side distant from the magnetoresistance effect element 10) of a stepped portion is small, and a main flow direction of the magnetic flux lines applied to the magnetization free layer 12 is not greatly changed depending on the presence of the first step. Therefore, in the case of FIG. 13A, a portion of a second step is the protruding portion 21A, and a portion of the first step belongs to the main portion 21B. On the other hand, in a case of FIG. 13B, a density of magnetic flux lines applied to the magnetization free layer 12 from a first step of a stepped portion is large, and a main flow direction of the magnetic flux lines applied to the magnetization free layer 12 is greatly changed depending on the presence of the first step. Thus, in the case of FIG. 13B, portions of the first step and the second step are the protruding portion 21A.

As illustrated in FIG. 13B, in a plan view when viewed in the z direction, when the protruding portion 21A has a multistep structure, the magnetization free layer 12 preferably have a portion that is free of overlapping with a predetermined portion of the second surface 21Aa, and a center of gravity of the magnetization free layer 12 preferably be positioned within the region A connecting a predetermined portion of the second surface 21Aa and the third surface 22a.

For example, when a shortest distance between an end portion of a surface of an (n)th step (n is an integer of two or more) from the main portion 21B side (a surface on the magnetoresistance effect element 10 side in the z direction) and an end portion of the third surface 22a is close to or equal to a shortest distance between a surface of an (n−1)th step and the third surface 22a, it is preferable to satisfy the above-described relationship by setting a surface from the surface of the (n)th step from the main portion 21B side to a surface on a side closest to the magnetoresistance effect element 10 in the z direction in the second surface 21Aa as the above-described predetermined portion. For example, in a case in which the protruding portion 21A has a two-step structure, when a shortest distance between an end portion of a surface of a second step from the main portion 21B side and the end portion of the third surface 22a is close to or equal to a shortest distance between a surface of a first step from the main portion 21B side and the third surface 22a, since the surface of the second step from the main portion 21B side and a surface on a side closest to the magnetoresistance effect element 10 in the z direction are the same surface, it is preferable to satisfy the above-described relationship by setting the surface of the second step from the main portion 21B side (a surface on the magnetoresistance effect element 10 side in the z direction) as the above-described predetermined portion.

On the other hand, in a case in which the relationship between the shortest distances is not satisfied, for example, as in the example of FIG. 13B, when a shortest distance between an end portion (corner portion E1) of a surface S2 of the second step and the end portion (corner portion E2) of the third surface 22a is farther than a shortest distance between a surface S1 of the first step and the third surface 22a, it is preferable that a predetermined relationship be satisfied with the entire surface of the second surface 21Aa including the first step.

Figure 14:
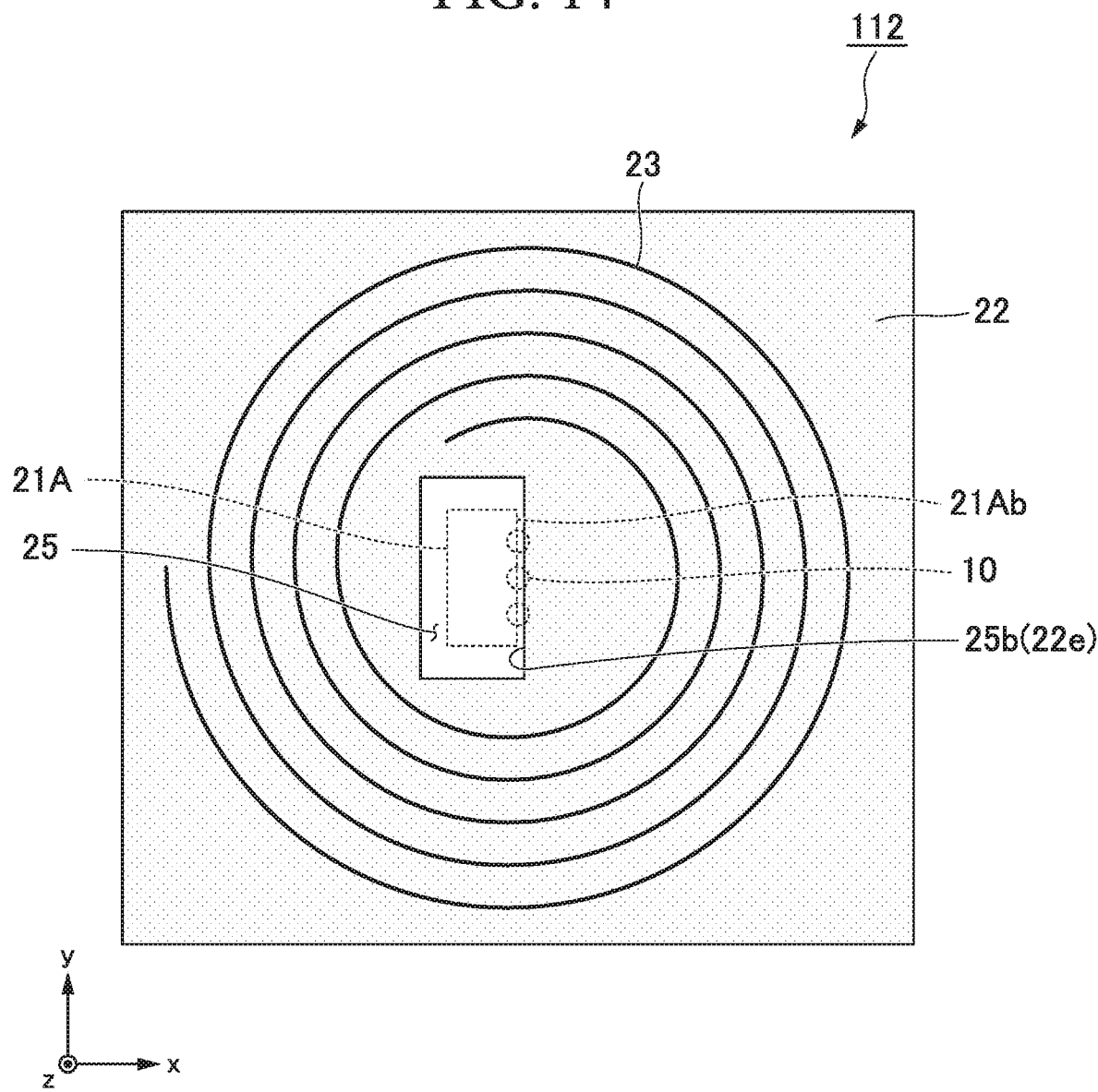
FIG. 14 is a schematic plan view of another example of the magnetoresistance effect device according to the first embodiment.
Figure 15:
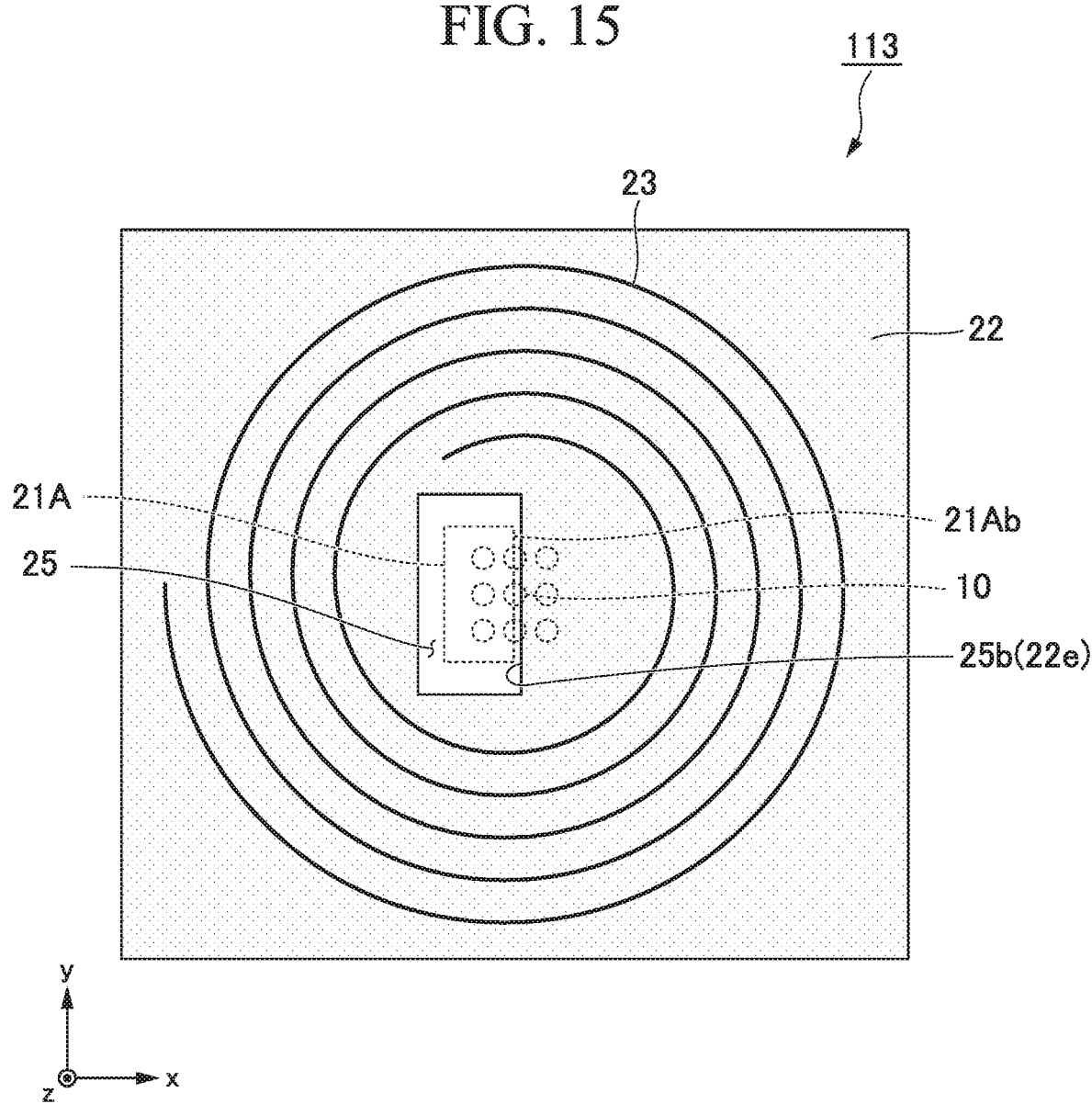
FIG. 15 is a schematic plan view of another example of the magnetoresistance effect device according to the first embodiment.

FIGS. 14 and 15 are views schematically illustrating another example of the magnetoresistance effect device according to the present embodiment. The magnetoresistance effect devices illustrated in FIGS. 14 and 15 are different from the magnetoresistance effect device 100 illustrated in FIG. 2 in that a plurality of magnetoresistance effect elements 10 are provided.

A magnetoresistance effect device 112 illustrated in FIG. 14 includes a magnetoresistance effect element row in which three magnetoresistance effect elements 10 are arranged in a line. A magnetoresistance effect device 113 illustrated in FIG. 15 includes three magnetoresistance effect element rows in each of which three magnetoresistance effect elements 10 are arranged in a line. In the magnetoresistance effect element row, three magnetoresistance effect elements 10 are disposed side by side along the first side surface 25b of the opening portion 25 and the second side surface 21Ab of the protruding portion 21A. The first side surface 25b and the second side surface 21Ab are parallel to each other.

The magnetoresistance effect device 112 illustrated in FIG. 14 can apply a magnetic field to the magnetization free layer 12 of each of the magnetoresistance effect elements 10 in an oblique direction. Also, a magnitude and a direction of the magnetic field applied to the three magnetoresistance effect elements 10 can be made substantially the same.

A magnetoresistance effect device 113 illustrated in FIG. 15 can apply a magnetic field to the magnetization free layer 12 of each of the magnetoresistance effect elements 10 in an oblique direction. Also, magnetic fields different in at least one of magnitude and direction can be applied to respective magnetoresistance effect element rows.

In FIGS. 14 and 15, an example in which one magnetoresistance effect element row is formed by three magnetoresistance effect elements 10 is illustrated, but the number of magnetoresistance effect elements 10 in one magnetoresistance effect element row is arbitrary as long as it is a plural number. Further, the number of magnetoresistance effect element rows is also arbitrary.

As described above, according to the magnetoresistance effect device of the present embodiment, it is possible to apply a magnetic field to the in-plane direction (xy plane) of the magnetization free layer 12 in an oblique direction.

Second Embodiment

Figure 16:
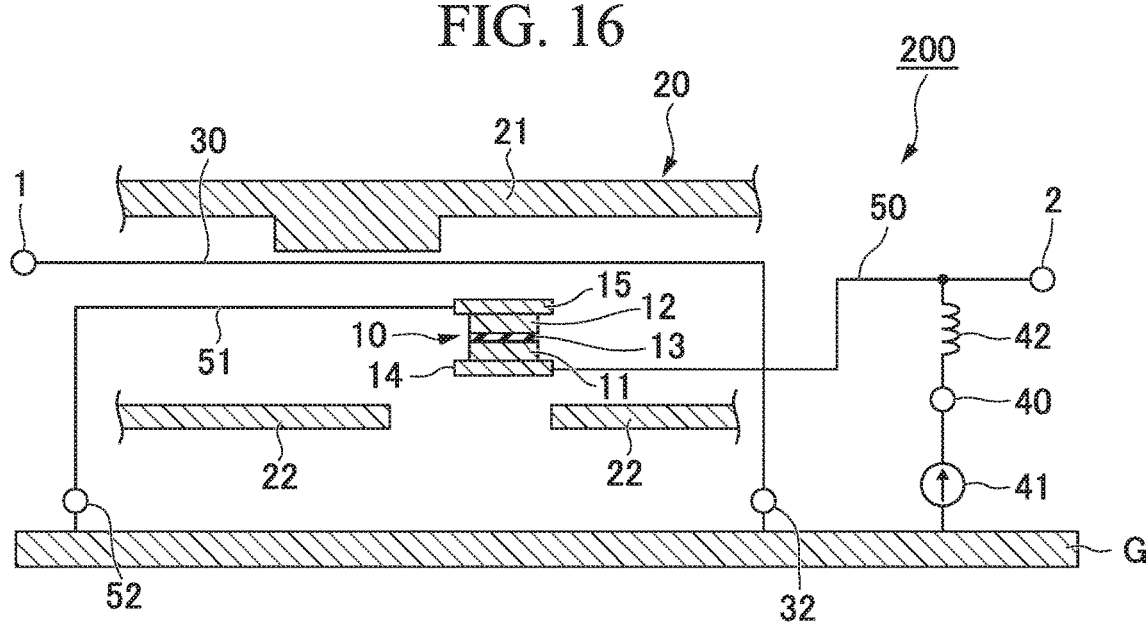
FIG. 16 is a schematic view illustrating a circuit configuration of a high-frequency device using a magnetoresistance effect device according to a second embodiment.

FIG. 16 is a schematic view illustrating a circuit configuration of a high-frequency device 200 using a magnetoresistance effect device according to a second embodiment. The high-frequency device 200 illustrated in FIG. 16 includes a magnetoresistance effect element 10, a magnetic field applying unit 20, a first signal line 30, and a direct current application terminal 40. In the high-frequency device 200, a signal is input from a first port 1 and a signal is output from a second port 2.

<Magnetoresistance Effect Element, Magnetic Field Applying Unit>

The magnetoresistance effect element 10 and the magnetic field applying unit 20 satisfying the configuration of the magnetoresistance effect device according to the above-described first embodiment can be used. In the magnetic field applying unit 20 illustrated in FIG. 16, only a main portion thereof is illustrated. A lower electrode 14 and an upper electrode 15 are provided in the magnetoresistance effect element 10 to enhance electrical conductivity.

The magnetic field applying unit 20 is capable of setting a frequency of an output signal. A frequency of the output signal is changed according to a ferromagnetic resonance frequency of a magnetization free layer 12. The ferromagnetic resonance frequency of the magnetization free layer 12 is changed according to an effective magnetic field in the magnetization free layer 12. The effective magnetic field in the magnetization free layer 12 is affected by an external magnetic field. Therefore, by changing a magnitude of an external magnetic field (static magnetic field) applied to the magnetization free layer 12 from the magnetic field applying unit 20, a ferromagnetic resonance frequency of the magnetization free layer 12 can be changed.

On the other hand, in order to obtain the high-frequency device 200 operating in a high frequency band (preferably 5 GHz or more, and more preferably 10 GHz or more), it is necessary to shift the ferromagnetic resonance frequency of the magnetization free layer 12 to a higher frequency. This time, it was found that a ferromagnetic resonance frequency of the magnetization free layer 12 can be shifted to a higher frequency when an external magnetic field is applied to the magnetization free layer 12 from an oblique direction. A preferred configuration of the magnetic field applying unit 20 capable of applying an external magnetic field to the magnetization free layer 12 from an oblique direction is the configuration illustrated in the first embodiment.

<First Port and Second Port>

The first port 1 is an input terminal of the high-frequency device 200. The first port 1 corresponds to one end of the first signal line 30. An alternate current signal (high frequency signal) can be applied to the high-frequency device 200 by connecting an alternate current signal source (not illustrated) to the first port 1. The high frequency signal applied to the high-frequency device 200 is, for example, a signal having a frequency of 100 MHz or more.

The second port 2 is an output terminal of the high-frequency device 200. The second port 2 corresponds to one end of an output signal line (second signal line) 50 transmitting a signal output from the magnetoresistance effect element 10.

<First Signal Line>

One end of the first signal line 30 in FIG. 16 is connected to the first port 1. Also, the high-frequency device 200 is used by connecting the other end of the first signal line 30 to a reference electric potential via a reference electric potential terminal 32. In FIG. 16, it is connected to a ground G as the reference electric potential. The ground G can be caused to be an external one of the high-frequency device 200. A high frequency current flows in the first signal line 30 according to a potential difference between a high frequency signal input to the first port 1 and the ground G. When the high frequency current flows in the first signal line 30, a high frequency magnetic field is generated from the first signal line 30. The high frequency magnetic field is applied to the magnetization free layer 12 of the magnetoresistance effect element 10.

The first signal line 30 is not limited to a single signal line and may be a plurality of signal lines. In this case, it is preferable to arrange the plurality of signal lines at a position that causes high frequency magnetic fields generated from the respective signal lines to reinforce each other at a position of the magnetoresistance effect element 10.

<Output Signal Line, Line>

An output signal line 50 transmits a signal output from the magnetoresistance effect element 10. The signal output from the magnetoresistance effect element 10 is a signal at a frequency selected by utilizing ferromagnetic resonance of the magnetization free layer 12. One end of the output signal line 50 in FIG. 16 is connected to the magnetoresistance effect element 10, and the other end thereof is connected to the second port 2. That is, the output signal line 50 in FIG. 16 connects the magnetoresistance effect element 10 and the second port 2.

Further, a capacitor may be provided in the output signal line 50 between the second port 2 and a portion constituting a closed circuit by a power supply 41, the output signal line 50, the magnetoresistance effect element 10, a line 51, and the ground G (for example, in the output signal line 50 between a connecting portion of an inductor 42 to the output signal line 50 and the second port 2). When a capacitor is provided in the portion, it is possible to avoid addition of an invariant component of a current to the output signal output from the second port 2.

One end of the line 51 is connected to the magnetoresistance effect element 10. Also, the high-frequency device 200 is used by connecting the other end of the line 51 to the reference electric potential via a reference electric potential terminal 52. The line 51 is connected to the ground G common to the reference electric potential of the first signal line 30 in FIG. 16, but the line 51 may be connected to other reference electric potentials. In order to simplify the circuit configuration, it is preferable that the reference electric potential of the first signal line 30 and the reference electric potential of the line 51 be shared.

It is preferable that a shape of each of the lines and the ground G be defined as a microstrip line (MSL) type or a coplanar waveguide (CPW) type. When designing the microstrip line (MSL) type or the coplanar waveguide (CPW) type, it is preferable to design a line width and a distance between grounds such that characteristic impedance of the line is equivalent to impedance of the circuit system. By designing like this, it is possible to inhibit a transmission loss of the line.

<Direct Current Application Terminal>

The direct current application terminal 40 is connected to the power supply 41 and applies a direct current or a direct current voltage in a stacking direction of the magnetoresistance effect element 10. In the present specification, the direct current refers to a current whose direction does not change with time and includes a current whose magnitude varies with time. Further, the direct current voltage refers to a voltage whose polarity does not change with time and also includes a voltage whose magnitude varies with time. The power supply 41 may be either a direct current power supply or a direct current voltage power supply.

The power supply 41 may be either a direct current power supply capable of generating a constant direct current or a direct current voltage power supply capable of generating a constant direct current voltage. Further, the power supply 41 may be a direct current power supply in which a magnitude of a generated direct current value is variable or a direct current voltage power supply in which a magnitude of a generated direct current voltage value is variable.

A current density of a current applied to the magnetoresistance effect element 10 is preferably lower than an oscillation threshold current density of the magnetoresistance effect element 10. The oscillation threshold current density of the magnetoresistance effect element 10 refers to a current density of a threshold value at which, when a current with a current density higher than this value is applied, magnetization of the magnetization free layer 12 of the magnetoresistance effect element 10 starts precession at a constant frequency and a constant amplitude and the magnetoresistance effect element 10 oscillates (an output (resistance value) of the magnetoresistance effect element 10 changes at a constant frequency and a constant amplitude).

The inductor 42 is disposed between the direct current application terminal 40 and the output signal line 50. The inductor 42 cuts off high frequency components of current and passes invariant components of current. An output signal (high frequency signal) output from the magnetoresistance effect element 10 flows efficiently to the second port 2 by the inductor 42. Further, the invariant components of current flow through the closed circuit of the power supply 41, the output signal line 50, the magnetoresistance effect element 10, the line 51, and the ground G by the inductor 42.

A chip inductor, an inductor with a patterned line, a resistive element having inductive components, or the like can be used for the inductor 42. Inductance of the inductor 42 is preferably 10 nH or more.

<Function of High-Frequency Device>

When a high frequency signal is input to the high-frequency device 200 from the first port 1, a high frequency current corresponding to the high frequency signal flows in the first signal line 30. A high frequency magnetic field generated by the high frequency current flowing in the first signal line 30 is applied to the magnetization free layer 12 of the magnetoresistance effect element 10.

Magnetization of the magnetization free layer 12 greatly oscillates when a frequency of the high frequency magnetic field applied to the magnetization free layer 12 by the first signal line 30 is in the vicinity of a ferromagnetic resonance frequency of the magnetization free layer 12. This phenomenon is a ferromagnetic resonance phenomenon.

When the magnetization oscillation of the magnetization free layer 12 increases, a variation in resistance value in the magnetoresistance effect element 10 increases. For example, when a constant direct current is applied to the magnetoresistance effect element 10 from the direct current application terminal 40, a variation in resistance value of the magnetoresistance effect element 10 is output from the second port 2 as a variation in potential difference between the lower electrode 14 and the upper electrode 15. Further, for example, when a constant direct current voltage is applied to the magnetoresistance effect element 10 from the direct current application terminal 40, a variation in resistance value of the magnetoresistance effect element 10 is output from the second port 2 as a variation in current value flowing between the lower electrode 14 and the upper electrode 15.

That is, when a frequency of the high frequency signal input from the first port 1 is in the vicinity of a ferromagnetic resonance frequency of the magnetization free layer 12, an amount of variation in the resistance value of the magnetoresistance effect element 10 is large and a large signal is output from the second port 2. On the other hand, when a frequency of the high frequency signal is out of the ferromagnetic resonance frequency of the magnetization free layer 12, an amount of variation in the resistance value of the magnetoresistance effect element 10 is small and almost no signal is output from the second port 2. That is, the high-frequency device 200 functions as a high-frequency filter capable of selectively passing a high frequency signal of a specific frequency.

<Other Applications>

In the above description, an example in which the high-frequency device is used as a high-frequency filter has been described, but the magnetoresistance effect device can also be utilized as high-frequency devices such as isolators, phase shifters, amplifiers (amplifiers), or the like.

When the high-frequency device is used as an isolator, a signal is input from the second port 2. Also when a signal is input from the second port 2, since there is no output from the first port 1, the high-frequency device functions as an isolator.

When the high-frequency device is used as a phase shifter, in a case in which an output frequency band changes, attention is paid to a frequency of an arbitrary point in the output frequency band. When an output frequency band changes, since a phase at a specific frequency changes, the high-frequency device functions as a phase shifter.

When the high-frequency device is used as an amplifier, a direct current or a direct current voltage applied from the power supply 41 is caused to become a predetermined magnitude or more. In this way, a signal output from the second port 2 becomes larger than a signal input from the first port 1, and the high-frequency device functions as an amplifier.

As described above, the high-frequency device 200 according to the second embodiment can function as high-frequency devices such as high-frequency filters, isolators, phase shifters, amplifiers, or the like.

Further, an example in the case with one magnetoresistance effect element 10 has been illustrated in FIG. 16, but a plurality of magnetoresistance effect elements 10 may be provided. In this case, the plurality of magnetoresistance effect elements 10 may be connected in parallel to each other, may be connected in series, or may be connected in combination of parallel connection and series connection. For example, when a plurality of magnetoresistance effect elements 10 having different ferromagnetic resonance frequencies are used, selectable frequency bands (passing frequency bands) can be expanded. Further, a configuration in which a high frequency magnetic field generated in the output signal line 50 which outputs an output signal output from one magnetoresistance effect element is applied to another magnetoresistance effect element may also be used. With such a configuration, the output signal is filtered a plurality of times. Therefore, filtering accuracy of the high frequency signal can be enhanced.

When a plurality of magnetoresistance effect elements 10 are provided, the magnetoresistance effect elements 10 may be disposed as illustrated in FIGS. 14 and 15. In a plan view when viewed in a z direction, the magnetoresistance effect element 10 is disposed such that a plurality of magnetoresistance effect elements 10 are disposed side by side along the first side surface 25b of the opening portion 25 and the second side surface 21Ab of the protruding portion 21A. The respective magnetoresistance effect elements 10 may be connected in parallel to each other, may be connected in series, or may be connected in combination of parallel connection and series connection.

As described above, in a case of the configuration of FIG. 14, a magnetic field with substantially the same magnitude and the same direction can be applied to the respective magnetization free layers 12 of the magnetoresistance effect elements 10. When the magnetoresistance effect elements 10 with the same characteristics are connected in parallel or in series, a signal/noise (S/N) ratio in output of the high-frequency device is improved. This is because the output signals from the respective magnetoresistance effect elements 10 are in the same phase and in a relationship of reinforcing each other, whereas phases of noise are random and do not reinforce each other as much as the output signals. Also, by connecting the magnetoresistance effect elements 10 in parallel or in series, a current or voltage applied to the respective magnetoresistance effect elements 10 is decreased and a withstand current or a withstand voltage of each of the magnetoresistance effect elements 10 is improved.

Further, in a case of the configuration of FIG. 15, magnetic fields in which at least one of a magnitude and a direction is different from each other can be applied to the magnetization free layer 12 of the respective magnetoresistance effect elements 10 of different magnetoresistance effect element rows. By causing magnetic fields applied to the respective magnetoresistance effect element 10 to be different and causing ferromagnetic resonance frequencies of the respective magnetoresistance effect element 10 to be different, a bandwidth of the high-frequency device can be expanded. Also, by connecting the magnetoresistance effect elements 10 in parallel or in series, a current or voltage applied to the respective magnetoresistance effect elements 10 is decreased and a withstand current or a withstand voltage of each of the magnetoresistance effect elements 10 is improved.

Figure 17:
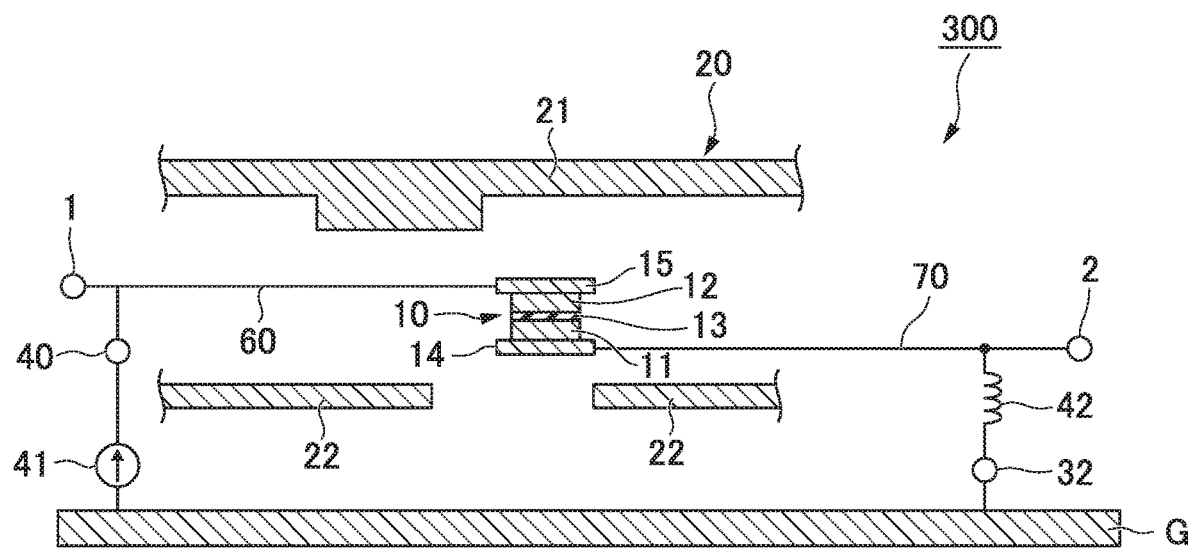
FIG. 17 is a schematic view illustrating a circuit configuration of another example of a high-frequency device using the magnetoresistance effect device according to the second embodiment.

Here, the high-frequency device 200 illustrated in FIG. 16 is a magnetic field driven type high-frequency device that is driven by applying a high frequency magnetic field from the first signal line 30 to the magnetization free layer 12. The high-frequency device is not limited to the magnetic field driven type and may be a current driven type. FIG. 17 is a schematic view illustrating a circuit configuration of a current driven type high-frequency device using the magnetoresistance effect device according to the second embodiment.

A high-frequency device 300 illustrated in FIG. 17 includes the magnetoresistance effect element 10, the magnetic field applying unit 20, the direct current application terminal 40, an input signal line 60, and an output signal line 70. Also in FIG. 17, only a main portion in the magnetic field applying unit 20 is illustrated. Components the same as those of the high-frequency device 200 illustrated in FIG. 16 are denoted with the same references. The input signal line 60 is a wiring between the first port 1 and the upper electrode 15, and the output signal line 70 is a wiring between the second port 2 and the lower electrode 14.

In the high-frequency device 300, a signal is input from the first port 1 and a signal is output from the second port 2. In the high-frequency device 300 illustrated in FIG. 17, magnetization of the magnetization free layer 12 oscillates due to a spin transfer torque generated by causing a current to flow in a stacking direction of the magnetoresistance effect element 10. When an input high frequency signal is in the vicinity of a ferromagnetic resonance frequency of the magnetization free layer 12 (in this case, also referred to as a spin torque resonance frequency of the magnetoresistance effect element 10), magnetization of the magnetization free layer 12 oscillates greatly. When magnetization of the magnetization free layer 12 oscillates periodically, a resistance value of the magnetoresistance effect element 10 changes periodically.

That is, when a frequency of the high frequency signal input from the first port 1 is in the vicinity of the ferromagnetic resonance frequency of the magnetization free layer 12, an amount of variation in resistance value of the magnetoresistance effect element 10 is large and a large signal is output from the second port 2. On the other hand, when the frequency of the high frequency signal is out of the ferromagnetic resonance frequency of the magnetization free layer 12, an amount of variation in the resistance value of the magnetoresistance effect element 10 is small and almost no signal is output from the second port 2. That is, the high-frequency device 300 can also function as a high-frequency filter capable of selectively passing a high frequency signal of a specific frequency.

Also in the high-frequency device 300 in FIG. 17, a frequency of the output signal can be set by the magnetic field applying unit 20. The magnetic field applying unit 20 can apply an external magnetic field to the magnetoresistance effect element 10 from an oblique direction. Therefore, a ferromagnetic resonance frequency of the magnetization free layer 12 can be set to a higher frequency.

As described above, according to the high-frequency devices 200 and 300 of the present embodiment, it is possible to apply a magnetic field to the magnetization free layer 12 from an oblique direction. Therefore, a ferromagnetic resonance frequency of the magnetization free layer 12 can be shifted to a higher frequency, and a high-frequency device which can be driven at high frequency can be realized.

While embodiments of the present disclosure have been described above in detail with reference to the accompanying drawings, the respective configurations and combinations thereof in the present embodiment are merely examples, and additions, omissions, substitutions, and other changes to the configurations are possible without departing from the spirit of the present disclosure.

Figure 18:
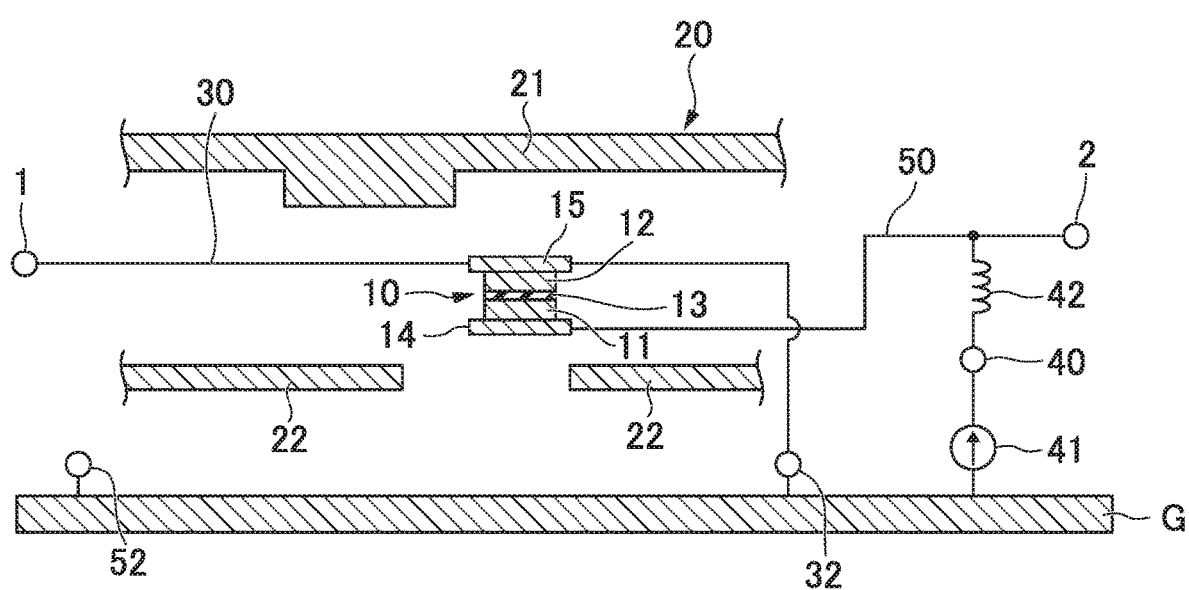
FIG. 18 is a schematic view illustrating a circuit configuration of another example of a high-frequency device using the magnetoresistance effect device according to the second embodiment.

For example, the first signal line 30 may also serve as the lower electrode 14 or the upper electrode 15 connected to the magnetoresistance effect element 10. FIG. 18 is a schematic view of a high-frequency device in which the first signal line 30 also serves as the upper electrode 15 connected to the magnetoresistance effect element 10. In the high-frequency device illustrated in FIG. 18, the first signal line 30 is connected to the magnetization free layer 12 of the magnetoresistance effect element 10. In this case, magnetization of the magnetization free layer 12 can be caused to oscillate by utilizing a high frequency magnetic field generated by a high frequency current flowing in the first signal line 30 and applied to the magnetization free layer 12. Also, magnetization of the magnetization free layer 12 may be caused to oscillate by utilizing a spin transfer torque generated by a high frequency current flowing in a stacking direction of the magnetoresistance effect element 10 from the first signal line 30. Further, magnetization of the magnetization free layer 12 may be caused to oscillate by utilizing a spin orbit torque by a spin current generated in a direction perpendicular to a flow direction of a high frequency current flowing through a portion corresponding to the upper electrode 15 of the first signal line 30. That is, magnetization of the magnetization free layer 12 can be caused to oscillate by utilizing at least one of these high frequency magnetic field, spin transfer torque and spin orbit torque.

Further, in the high-frequency devices 200 and 300, the direct current application terminal 40 may be connected between the inductor 42 and the ground G, or may be connected between the upper electrode 15 and the ground G.

Also, in place of the inductor 42 in the above-described embodiment, a resistive element may be used. This resistive element has a function of cutting off high frequency components of current by resistive components. This resistive element may be either a chip resistor or a resistor by a patterned line. A resistance value of this resistive element is preferably equal to or higher than characteristic impedance of the output signal line 50. For example, when characteristic impedance of the output signal line 50 is 50Ω and a resistance value of the resistive element is 50Ω, high frequency power of 45% can be cut off by the resistive element. In addition, when characteristic impedance of the output signal line 50 is 50Ω and a resistance value of the resistive element is 500Ω, high frequency power of 90% can be cut off by the resistive element. Also in this case, it is possible to cause an output signal output from the magnetoresistance effect element 10 to flow efficiently to the second port 2.

Further, in the above-described embodiment, when the power supply 41 connected to the direct current application terminal 40 has a function of cutting off high frequency components of current and a function of passing invariant components of current at the same time, the inductor 42 may be omitted. Also in this case, it is possible to cause an output signal output from the magnetoresistance effect element 10 to flow efficiently to the second port 2.

The magnetoresistance effect device according to the present embodiment is also applicable to an oscillator using a spin torque oscillation effect in which oscillation is generated in magnetization of the magnetization free layer by applying a direct current to the magnetoresistance effect element. Further, the magnetoresistance effect device according to the present embodiment is also applicable to rectifiers and detectors using a spin torque diode effect in which a direct current voltage is generated caused by oscillation in magnetization of the magnetization free layer when a high frequency current (alternating current) is applied to the magnetoresistance effect element.

Further, although an example in which the magnetoresistance effect device is used as a high-frequency device has been described, the magnetoresistance effect device is applicable also to other devices such as magnetic sensors as long as it is useful to apply a magnetic field obliquely to a stacking direction or a stacking plane of the magnetoresistance effect element.

EXAMPLES

Example 1

Figure 19A:
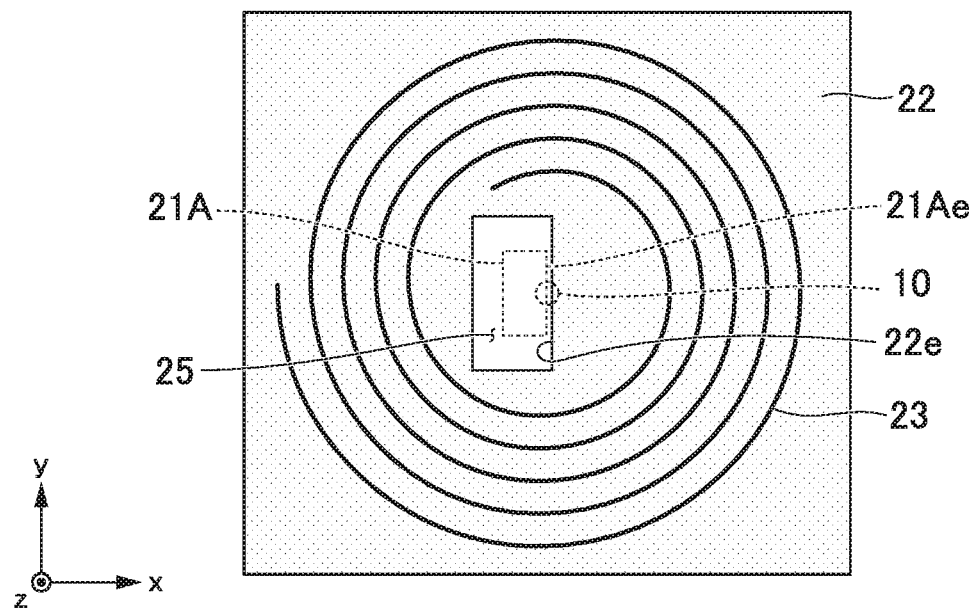
FIG. 19A is a view schematically illustrating a magnetoresistance effect device according to an example.
Figure 19B:
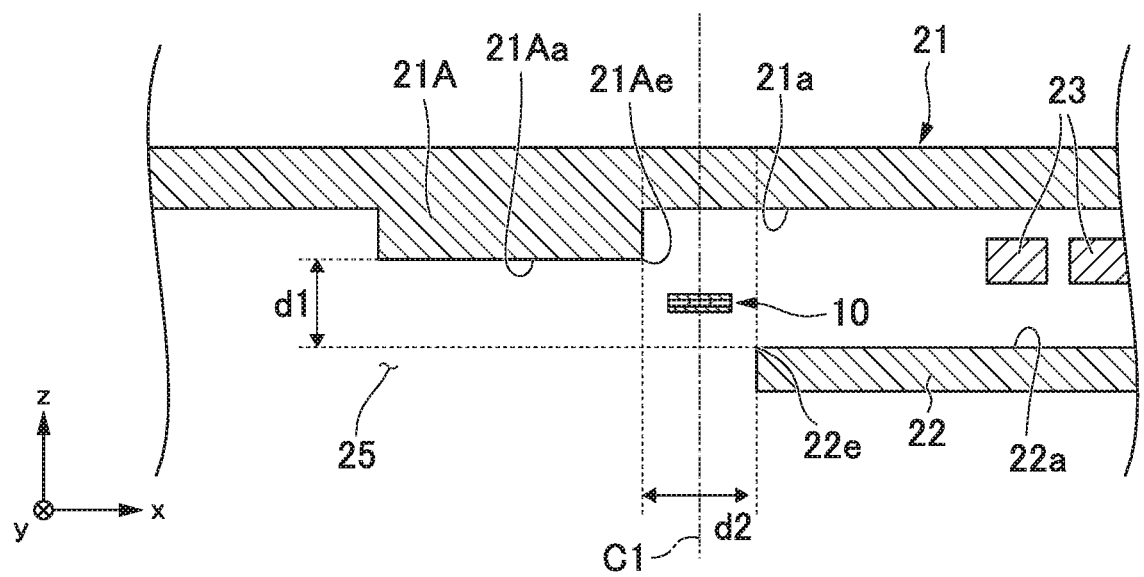
FIG. 19B is a view schematically illustrating a magnetoresistance effect device according to an example.

In a case of using the magnetic field applying unit as illustrated in FIGS. 19A and 19B, a magnetic field strength at a predetermined position and a magnetic field angle at that position were obtained by a simulation.

The magnetic field applying unit is constituted by the first ferromagnetic material 21 having a rectangular protruding portion 21A, the second ferromagnetic material 22 having a rectangular opening portion 25, and a coil 23 wound around the protruding portion 21A. Shapes of the first ferromagnetic material 21 and the second ferromagnetic material 22 in a plan view were set to a rectangle of 80 μm×80 am. Further, a shape of the protruding portion 21A in a plan view was a rectangle of 2.5 μm×m, and a height from the first surface 21*a* of the protruding portion 21A was set to 750 nm. Also, a shape of the opening portion 25 in a plan view was set to 6 μm×10 μm. The protruding portion 21A of the first ferromagnetic material 21 overlapped the opening portion 25 and was enclosed therein in a plan view. Further, a thickness of the coil 23 was set to 420 nm, and the coil 23 was wound around the protruding portion 21A 30 turns.

A distance d1 in the z direction between the second surface 21Aa of the protruding portion 21A and the third surface 22*a* of the second ferromagnetic material 22 was 800 nm, and a distance d2 in the x direction between the first end portion 21Ae of the second surface 21Aa and the first end portion 22*e* of the third surface 22*a* was 800 nm. Then, a magnetic field strength and a magnetic field angle were obtained at a position in an oblique direction from the first end portion 21Ae of the second surface 21Aa toward the first end portion 22*e* of the third surface 22*a*. The magnetic field strength and the magnetic field angle were obtained at a position at which a distance in the x direction from the first end portion 21Ae of the second surface 21Aa was the same as a distance in the z direction therefrom. The position in a y direction was the same as a position in the y direction of a center of gravity of the protruding portion 21A.

Figure 20:
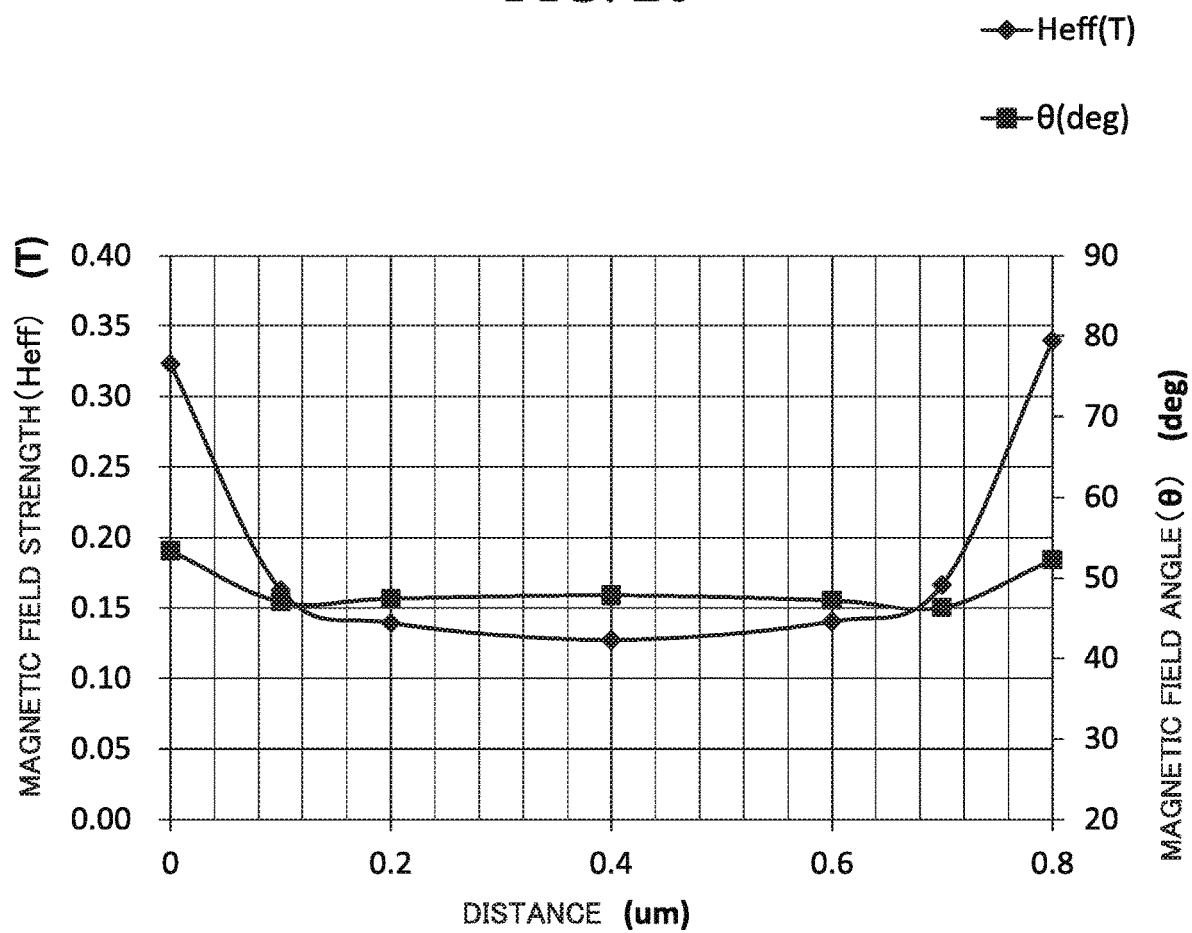
FIG. 20 is a view showing a magnetic field strength and a magnetic field angle of a magnetic field generated by a magnetic field applying unit illustrated in Example 1.

FIG. 20 is a view showing a magnetic field strength and a magnetic field angle at a position along an oblique direction from the first end portion 21Ae of the second surface 21Aa toward the first end portion 22*e* of the third surface 22*a* in an arrangement of the first example. A horizontal axis represents the distance in the x direction or the distance in the z direction from the first end portion 21Ae of the second surface 21Aa, and a vertical axis represents a magnetic field strength or a magnetic field angle. The magnetic field angle is an angle with respect to the xy plane. As illustrated in FIG. 20, when a center of gravity of the magnetization free layer 12 is disposed at these positions, it is possible to apply a magnetic field to the magnetization free layer 12 from an oblique direction in a range of about 45° to 55°.

Example 2

In a second example, when the distance d1 in the z direction between the second surface 21Aa of the protruding portion 21A and the third surface 22*a* of the second ferromagnetic material 22 was fixed at 800 nm and the distance d2 in the x direction between the first end portion 21Ae of the second surface 21Aa and the first end portion 22*e* of the third surface 22*a* was changed, an application angle of the magnetic field applied to the magnetization free layer 12 was obtained. In Example 2-1 and Example 2-2, the first perpendicular line C1 was set to pass through a midpoint position in the x direction between the first end portion 21Ae of the second surface 21Aa and the first end portion 22*e* of the third surface 22*a*. In Examples 2-3 to 2-7, the first perpendicular line C1 was set at the same position as the first end portion 21Ae of the second surface 21Aa. Further, a position of the center of gravity of the magnetization free layer 12 in the z direction was set to 400 nm from each of the second surface 21Aa and the third surface 22*a*. A position of the center of gravity of the magnetization free layer 12 in the y direction was the same as a position of the center of gravity of the protruding portion 21A in the y direction. The other conditions were the same as those in Example 1, and a magnetic field angle at the position of the center of gravity of the magnetization free layer 12 was obtained. The results are shown in Table 1. The distance d2 was denoted as a minus when the second surface 21Aa of the protruding portion 21A and the third surface 22a of the second ferromagnetic material 22 overlap each other.

TABLE 1

|  | Example 2-1 | Example 2-2 | Example 2-3 | Example 2-4 | Example 2-5 | Example 2-6 | Example 2-7 |
|---|---|---|---|---|---|---|---|
| d1(μm) | 0.8 | 0.8 | 0.8 | 0.8 | 0.8 | 0.8 | 0.8 |
| d1(μm) | 2.0 | 1.0 | 0 | −0.5 | −1.0 | −1.5 | −2.0 |
| \|d2/d1\| | 2.5 | 1.25 | 0 | 0.625 | 1.25 | 1.875 | 2.5 |
| Application angle | 45° | 50° | 55° | 65° | 70° | 75° | 80° |

As illustrated in Table 1, by changing the distance d2 in the x direction between the first end portion 21Ae of the second surface 21Aa and the first end portion 22e of the third surface 22a, an application angle of the magnetic field applied to the magnetization free layer 12 can be freely designed. Further, it is possible to make the application angle fall within a range of 45° to 80° by satisfying |d2/d1|≤2.5.

Example 3

In a third example, similarly to the second example, the distance d1 in the z direction between the second surface 21Aa of the protruding portion 21A and the third surface 22a of the second ferromagnetic material 22 was fixed at 800 nm, and the distance d2 in the x direction between the first end portion 21Ae of the second surface 21Aa and the first end portion 22e of the third surface 22a was changed. The second surface 21Aa of the protruding portion 21A and the third surface 22a of the second ferromagnetic material 22 were caused not to overlap when viewed in the z direction, and the distance d2 thereof was set to 0.3 μm (Example 3-1), 0.6 μm (Example 3-2), 0.8 μm (Example 3-3), and 1.0 am (Example 3-4). Then, in order to confirm how the magnetic field strength and the magnetic field angle change depending on a position in the x direction (a position in the z direction was fixed at a position of 400 nm from the second surface 21Aa and the third surface 22a), a magnetic field strength and a magnetic field angle in a range of a distance of 2.0 times the distance d2 in a direction from the first end portion 21Ae of the second surface 21Aa to the first end portion 22e of the third surface 22a were obtained. The other conditions were the same as those in Example 1.

Figure 21A:
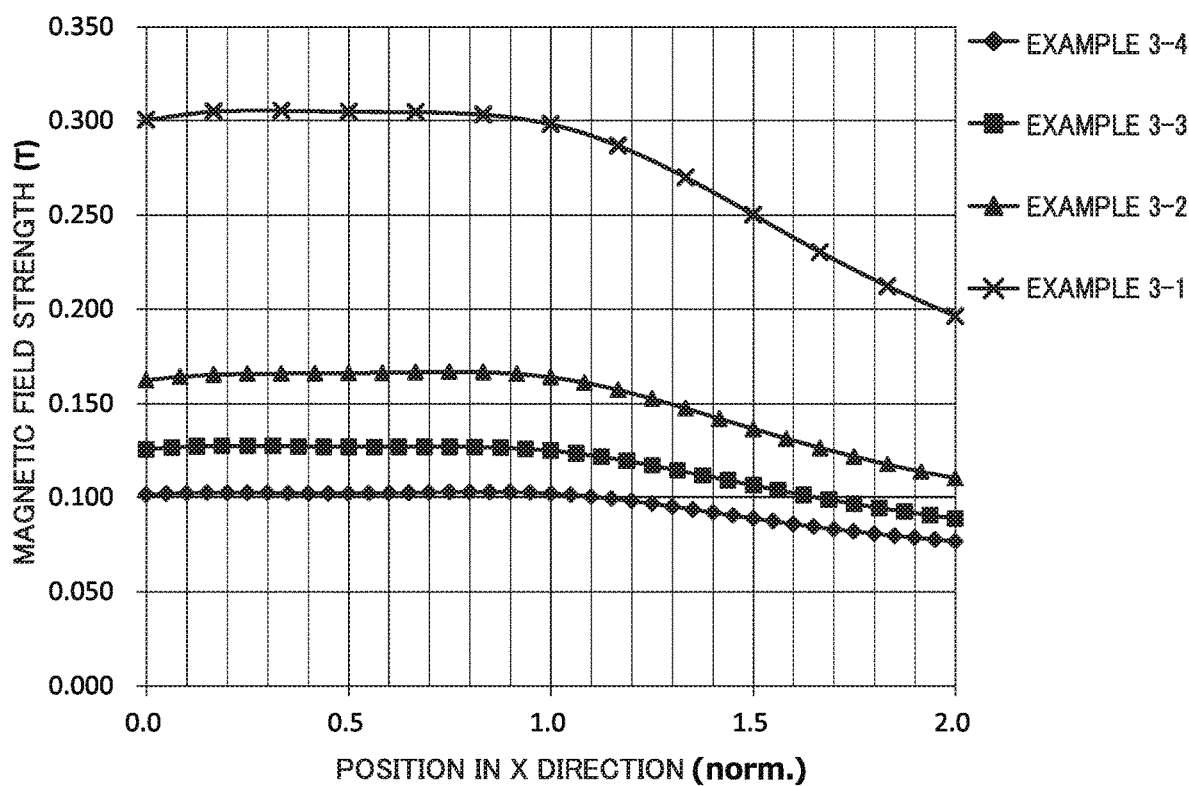
FIG. 21A is a view showing a magnetic field strength of a magnetic field generated by a magnetic field applying unit illustrated in Example 3.
Figure 21B:
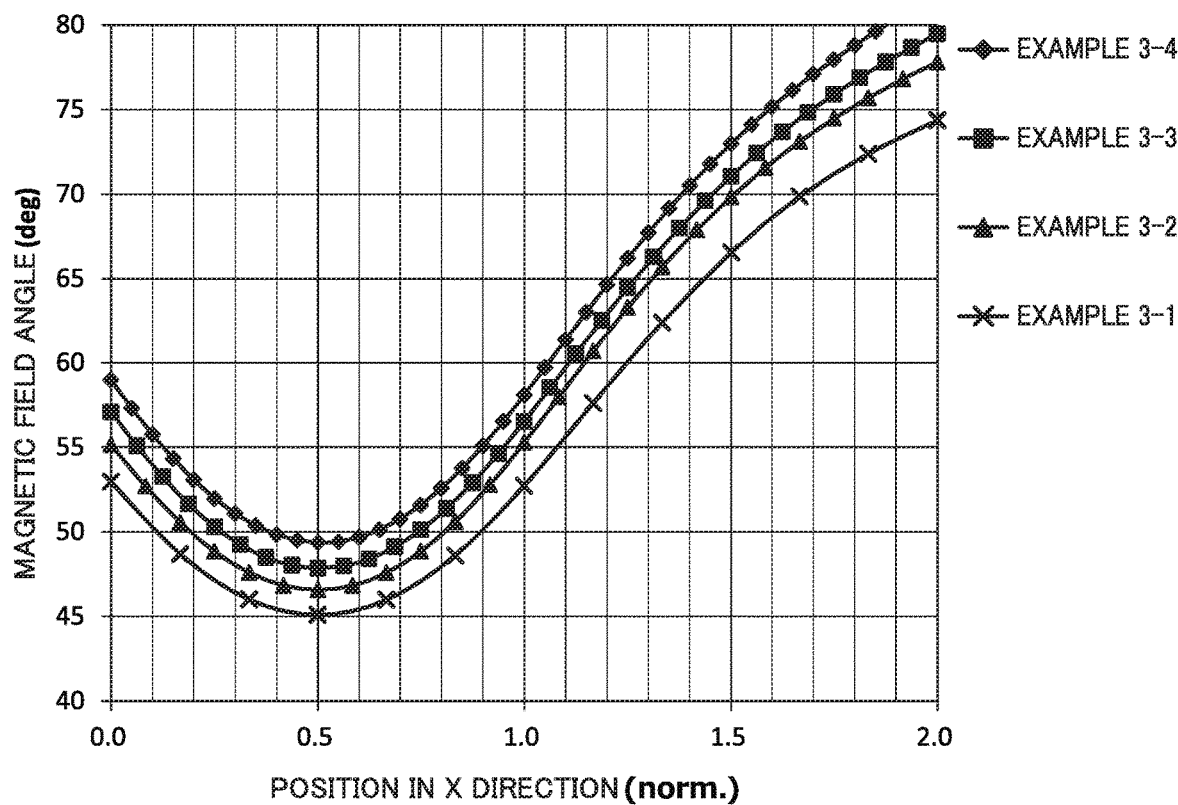
FIG. 21B is a view showing a magnetic field angle of a magnetic field generated by a magnetic field applying unit illustrated in Example 3.

FIGS. 21A and 21B are views showing a magnetic field strength and a magnetic field angle of a magnetic field generated by the magnetic field applying unit illustrated in Example 3. A horizontal axis represents a value obtained by normalizing a distance in the x direction from the first end portion 21Ae of the second surface 21Aa to the distance d2 in the x direction between the first end portion 21Ae of the second surface 21Aa and the first end portion 22e of the third surface 22a. A vertical axis represents a magnetic field strength in FIG. 21A and a magnetic field angle in FIG. 21B.

As illustrated in FIGS. 21A and 21B, by changing the position in the x direction at which the center of gravity of the magnetization free layer 12 is provided, an application angle of the magnetic field applied to the magnetization free layer 12 can be changed. When a distance from the first end portion 21Ae of the second surface 21Aa of the protruding portion 21A exceeds 1.0 times the distance d2, the magnetic field strength decreases. Providing the center of gravity of the magnetization free layer 12 at a position at which a distance from the first end portion 21Ae of the second surface 21Aa of the protruding portion 21A exceeds 1.0 times the distance d2 means that the third surface 22a and the magnetization free layer 12 overlap at least in a portion when viewed in the z direction.

Example 4

In Example 4, the distance d2 in the x direction between the first end portion 21Ae of the second surface 21Aa and the first end portion 22e of the third surface 22a was fixed at 800 nm, and the distance d1 in the z direction between the second surface 21Aa of the protruding portion 21A and the third surface 22a of the second ferromagnetic material 22 was changed. The second surface 21Aa of the protruding portion 21A and the third surface 22a of the second ferromagnetic material 22 were caused not to overlap when viewed in the z direction. The distance d1 was set to 0.3 μm (Example 4-1), 0.6 μm (Example 4-2), 0.8 μm (Example 4-3), and 1.0 μm (Example 4-4). Then, in order to confirm how the magnetic field strength and the magnetic field angle change depending on a position in the z direction (the position in the x direction was fixed at a position of 400 nm from the first end portion 21Ae of the second surface 21Aa and the first end portion 22e of the third surface 22a), a magnetic field strength and a magnetic field angle in a range in the z direction from the second surface 21Aa to the third surface 22a were obtained. The other conditions were the same as those in Example 1.

Figure 22A:
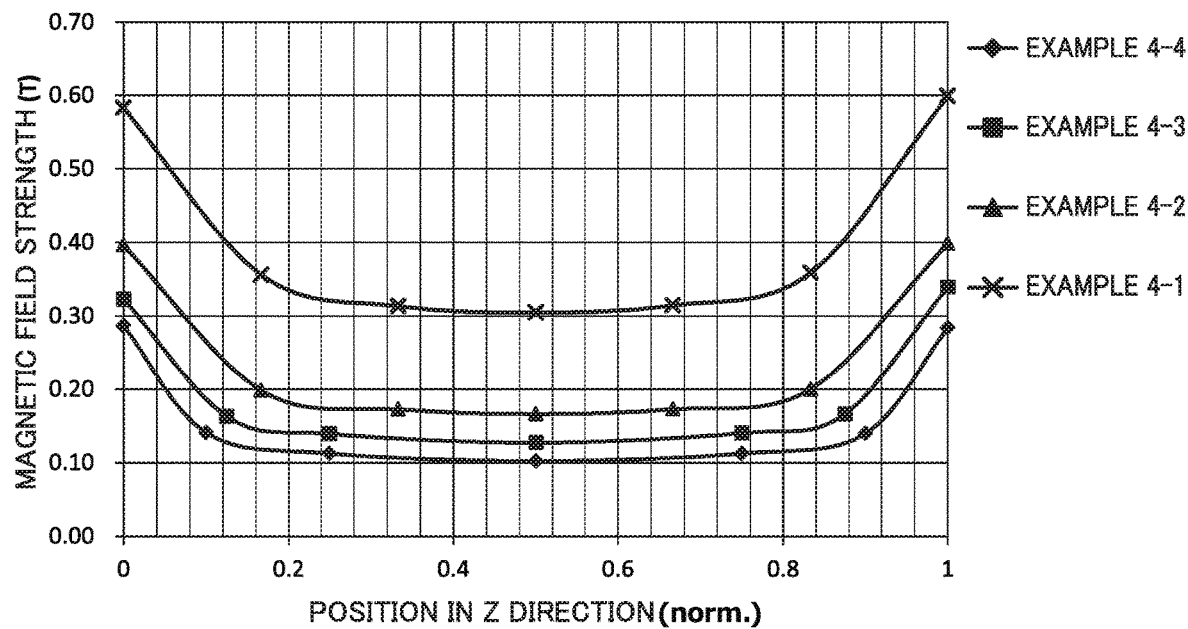
FIG. 22A is a view showing a magnetic field strength of the magnetic field generated by a magnetic field applying unit illustrated in Example 4.
Figure 22B:
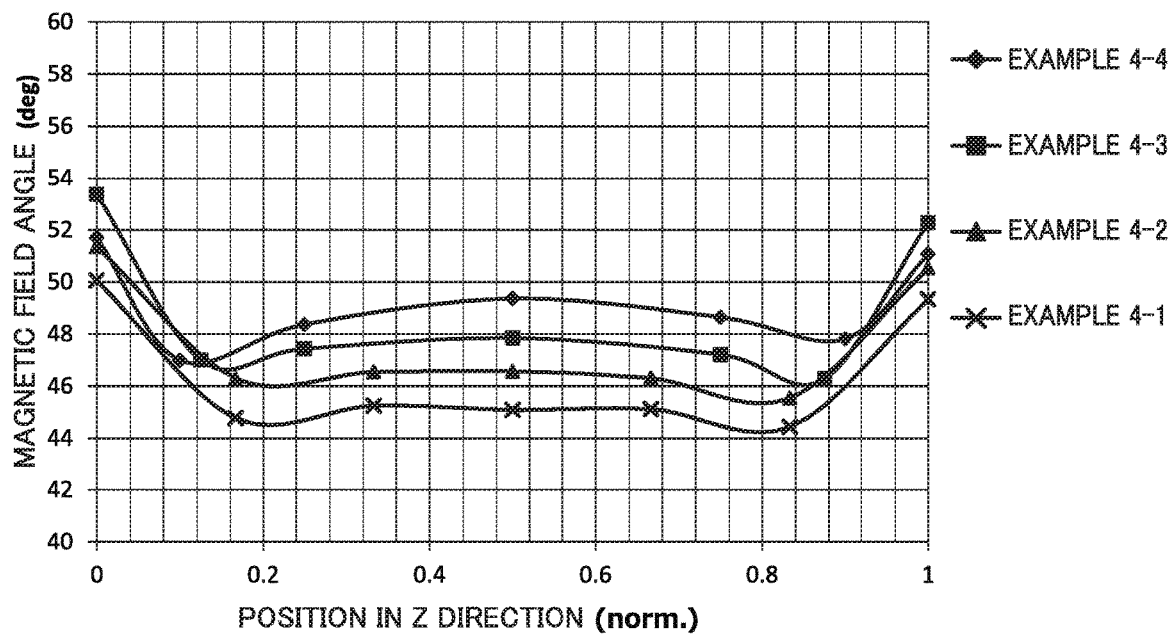
FIG. 22B is a view showing a magnetic field angle of the magnetic field generated by a magnetic field applying unit illustrated in Example 4.

FIGS. 22A and 22B are views showing a magnetic field strength and a magnetic field angle of the magnetic field generated by the magnetic field applying unit illustrated in Example 4. A horizontal axis is a value obtained by normalizing a distance in the z direction from the second surface 21Aa to the distance d1 in the z direction. A vertical axis represents a magnetic field strength in FIG. 22A and a magnetic field angle in FIG. 22B. When the center of gravity of the magnetization free layer 12 is disposed at each position illustrated in FIGS. 22A and 22B, a magnetic field in an oblique direction can be applied to the magnetization free layer 12 in all of Examples 4-1 to 4-4.

While preferred embodiments of the disclosure have been described and illustrated above, it should be understood that these are exemplary of the disclosure and are not to be considered as limiting. Additions, omissions, substitutions, and other modifications can be made without departing from the spirit or scope of the present disclosure. Accordingly, the invention is not to be considered as being limited by the foregoing description and is only limited by the scope of the appended claims.

What is claimed is:
1. A magnetoresistance effect device comprising:
at least one magnetoresistance effect element including:
a first magnetization free layer;
a magnetization fixed layer or a second magnetization free layer; and
a spacer layer sandwiched between the first magnetization free layer and the magnetization fixed layer or the second magnetization free layer; and
a magnetic field applying unit configured to apply a magnetic field at least to the first magnetization free layer of the magnetoresistance effect element, wherein
the magnetic field applying unit includes:
a first ferromagnetic material having a protruding portion protruding from a first surface to the magnetoresistance effect element side in a stacking direction of the magnetoresistance effect element;
a second ferromagnetic material sandwiching the magnetoresistance effect element together with the first ferromagnetic material; and
a coil wound around the first ferromagnetic material,
the first magnetization free layer of the magnetoresistance effect element includes a portion free of overlapping with at least one of a second surface of the protruding portion on the magnetoresistance effect element side in the stacking direction and a third surface of the second ferromagnetic material on the magnetoresistance effect element side in the stacking direction in a plan view when viewed in the stacking direction, and
a center of gravity of the first magnetization free layer of the magnetoresistance effect element is positioned in a region connecting the second surface and the third surface.

2. The magnetoresistance effect device according to claim 1, wherein
the first magnetization free layer of the magnetoresistance effect element includes a portion free of overlapping with the second surface in a plan view when viewed in the stacking direction.

3. The magnetoresistance effect device according to claim 1, wherein
the first magnetization free layer of the magnetoresistance effect element includes a portion free of overlapping with the third surface in a plan view when viewed in the stacking direction.

4. The magnetoresistance effect device according to claim 1, wherein
a perpendicular line passing through a center of gravity of the first magnetization free layer and extending in the stacking direction is free of overlapping with at least one of the second surface and the third surface in a plan view when the magnetoresistance effect element is viewed from the stacking direction.

5. The magnetoresistance effect device according to claim 4, wherein
the perpendicular line is free of overlapping with the second surface in a plan view when the magnetoresistance effect element is viewed from the stacking direction.

6. The magnetoresistance effect device according to claim 1, wherein
$d2/d1 \leq 2.5$ is satisfied when a distance between the second surface and the third surface in the stacking direction is d1 and a distance between end portions on the magnetoresistance effect element side of the second surface and the third surface in a perpendicular direction that is perpendicular to the stacking direction is d2 on a cut surface obtained by cutting through a center of gravity of the protruding portion and the center of gravity of the first magnetization free layer in the stacking direction.

7. The magnetoresistance effect device according to claim 1, wherein the second ferromagnetic material includes
an opening portion is formed to be opened in a plan view when viewed in the stacking direction; or
a recessed portion is formed to be recessed from the third surface toward a side opposite to the magnetoresistance effect element.

8. The magnetoresistance effect device according to claim 7, wherein, when viewed in the stacking direction,
a center of gravity of the opening portion or the recessed portion is positioned on a side opposite to the magnetoresistance effect element with respect to the center of gravity of the protruding portion, and
an end portion of the opening portion or the recessed portion on the magnetoresistance effect element side is positioned on the magnetoresistance effect element side with respect to the center of gravity of the protruding portion.

9. The magnetoresistance effect device according to claim 8, wherein the protruding portion is enclosed in the opening portion or the recessed portion in a plan view when viewed in the stacking direction.

10. The magnetoresistance effect device according to claim 7, wherein
a first side surface of the opening portion or the recessed portion and a second side surface of the protruding portion sandwiching the magnetoresistance effect element are parallel to each other in a plan view when viewed in the stacking direction.

11. The magnetoresistance effect device according to claim 10, wherein
the first side surface and the second side surface are straight lines in a plan view when viewed in the stacking direction.

12. The magnetoresistance effect device according to claim 10,
wherein the at least one magnetoresistance effect element includes a plurality of magnetoresistance effect elements, and
the magnetoresistance effect device includes a magnetoresistance effect element row in which the magnetoresistance effect elements are disposed side by side along the first side surface and the second side surface in a plan view when viewed in the stacking direction.

13. The magnetoresistance effect device according to claim 1, wherein
the first ferromagnetic material includes a second opening portion or a second recessed portion recessed from the first surface toward a side opposite to the magnetoresistance effect element on an outer side of the protruding portion in a plan view when viewed in the stacking direction.

* * * * *